United States Patent
Sun

(10) Patent No.: US 12,052,927 B2
(45) Date of Patent: Jul. 30, 2024

(54) MAGNETORESISTIVE STACK DEVICE FABRICATION METHODS

(71) Applicant: Everspin Technologies, Inc., Chandler, AZ (US)

(72) Inventor: Jijun Sun, Chandler, AZ (US)

(73) Assignee: EVERSPIN TECHNOLOGIES, INC., Chandler, AZ (US)

(*) Notice: Subject to any disclaimer, the term of this patent is extended or adjusted under 35 U.S.C. 154(b) by 487 days.

(21) Appl. No.: 17/270,681

(22) PCT Filed: Aug. 22, 2019

(86) PCT No.: PCT/US2019/047693
§ 371 (c)(1),
(2) Date: Feb. 23, 2021

(87) PCT Pub. No.: WO2020/041582
PCT Pub. Date: Feb. 27, 2020

(65) Prior Publication Data
US 2021/0343936 A1 Nov. 4, 2021

Related U.S. Application Data

(60) Provisional application No. 62/721,760, filed on Aug. 23, 2018.

(51) Int. Cl.
*H10N 50/01* (2023.01)
*H01C 10/00* (2006.01)
(Continued)

(52) U.S. Cl.
CPC ............. *H10N 50/01* (2023.02); *H01C 10/00* (2013.01); *H10B 61/22* (2023.02); *H10N 50/85* (2023.02)

(58) Field of Classification Search
CPC .............................. H10N 35/01; H10N 50/01
See application file for complete search history.

(56) References Cited

U.S. PATENT DOCUMENTS

| | | | |
|---|---|---|---|
| 6,146,754 A | 11/2000 | Song et al. | |
| 6,756,136 B1 | 6/2004 | Harkness, IV et al. | |

(Continued)

FOREIGN PATENT DOCUMENTS

| | | |
|---|---|---|
| CN | 1207778 A | 2/1999 |
| CN | 1652214 A | 8/2005 |
| CN | 107004764 A | 8/2017 |

OTHER PUBLICATIONS

PCT International Search Report and Written Opinion issued Jan. 30, 2020 in International Application No. PCT/US2019/047693 (20 pages).

(Continued)

*Primary Examiner* — Jae Lee
(74) *Attorney, Agent, or Firm* — Bookoff McAndrews, PLLC

(57) ABSTRACT

A method of fabricating a magnetoresistive device may comprise forming an electrically conductive region and forming a first seed region on one side of the electrically conductive region. A surface of the first seed region may be treated by exposing the surface to a gas. A second seed region may be formed on the treated surface of the first seed region. The method may also comprise forming a magnetically fixed region on one side of the second seed region.

20 Claims, 27 Drawing Sheets

(51) Int. Cl.
*H10B 61/00* (2023.01)
*H10N 50/85* (2023.01)

(56) References Cited

U.S. PATENT DOCUMENTS

| | | | |
|---|---|---|---|
| 8,686,484 B2 | 4/2014 | Whig et al. | |
| 8,747,680 B1 | 6/2014 | Deshpande et al. | |
| 9,023,216 B2 | 5/2015 | Kochergin et al. | |
| 9,136,464 B1 | 9/2015 | Whig et al. | |
| 9,419,208 B2 | 8/2016 | Whig et al. | |
| 9,990,940 B1* | 6/2018 | Kang | G11B 5/7379 |
| 10,535,390 B2 | 1/2020 | Aggarwal et al. | |
| 2011/0096443 A1 | 4/2011 | Zhang et al. | |
| 2011/0293967 A1* | 12/2011 | Zhang | G11B 5/66 |
| | | | 428/827 |
| 2012/0236631 A1* | 9/2012 | Park | H10N 50/10 |
| | | | 365/158 |
| 2015/0363136 A1* | 12/2015 | Uesugi | H01L 27/1225 |
| | | | 711/154 |
| 2016/0155932 A1 | 6/2016 | Chen et al. | |
| 2016/0254444 A1 | 9/2016 | Tahmasebi et al. | |
| 2017/0084821 A1 | 3/2017 | Kim et al. | |
| 2019/0131519 A1 | 5/2019 | Ikegawa et al. | |
| 2019/0140167 A1 | 5/2019 | Aggarwal et al. | |
| 2019/0157549 A1 | 5/2019 | Sun | |
| 2019/0165253 A1 | 5/2019 | Sun et al. | |
| 2019/0173004 A1 | 6/2019 | Deshpande et al. | |
| 2019/0304521 A1 | 10/2019 | Tahmasebi et al. | |
| 2019/0355897 A1 | 11/2019 | Sun | |
| 2020/0011943 A1* | 1/2020 | Zimmer | H01F 10/3272 |

OTHER PUBLICATIONS

Chinese Office Action issued on Oct. 22, 2023 in counterpart Chinese Patent Application No. 201980060090.4 (15 pages, in Chinese with English translation).

Chinese Office Action issued in counterpart Chinese Patent Application No. 201980060090.4, dated May 1, 2024 (25 Pages, in Chinese with English Translation).

* cited by examiner

MAGNETORESISTIVE STACK DEVICE FABRICATION METHODS

CROSS-REFERENCE TO RELATED APPLICATION(S)

This application is the U.S. National Phase Entry under 35 U.S.C. § 371 of International Application No. PCT/US2019/047693, filed on Aug. 22, 2019. The International Application No. PCT/US2019/047693 claims priority to U.S. Provisional Application No. 62/721,760, filed on Aug. 23, 2018, which is incorporated by reference herein in its entirety.

TECHNICAL FIELD

The present disclosure relates to, among other things, embodiments and aspects of magnetoresistive stacks/structures and methods therefor, including methods of use and methods of manufacturing the disclosed magnetoresistive stacks/structures.

INTRODUCTION

There are many inventions described and illustrated herein, as well as many aspects and embodiments of those inventions. In one aspect, the present disclosure relates to a magnetoresistive stack/structure (for example, a magnetoresistive memory stack/structure or a magnetoresistive sensor/transducer stack/structure) and methods of manufacturing such a stack/structure. In one embodiment, the disclosed magnetoresistive stack/structure is implemented in an MTJ (magnetic tunnel junction)-type magnetoresistive stack/structure having a perpendicular magnetic anisotropy, wherein the fixed magnetic region maintains or includes improved properties (for example, magnetoresistance (MR) and resistance-area product (RA) of the stack/structure) after subsequent or additional processing. The principles described herein also are applicable to in-plane magnetoresistive stacks/structures. Notably, the embodiments described herein may employ any technique now-known or later-developed to manufacture the MTJ stack/structure; all such techniques are intended to fall within the scope of the present disclosure. In one embodiment, the described MTJ stack/structure may be implemented as a magnetoresistive memory stack/structure.

Briefly, a magnetoresistive memory stack/structure, in one embodiment, includes at least one non-magnetic layer (for example, at least one dielectric layer or at least one electrically conductive layer) disposed between a "fixed" magnetic region and a "free" magnetic region, each including a plurality of layers of one or more magnetic or ferromagnetic materials. Information may be stored in the magnetoresistive memory stack/structure by switching, programming, and/or controlling the direction of magnetization vectors in one or more of the magnetic layers of the "free" magnetic region of the stack/structure. Here, the direction of the magnetization vectors of the "free" magnetic region may be switched and/or programmed (for example, through spin-transfer-torque (STT) or spin-orbit-torque (SOT)) by application of a write signal (e.g., one or more current pulses) to or through the magnetoresistive memory stack/structure while, in contrast, the magnetization vectors in the magnetic layers of a "fixed" magnetic region are magnetically fixed (e.g., in a predetermined direction) during application of the write signal.

The magnetoresistive memory stack/structure includes an electrical resistance that depends on the magnetic state of certain regions of the memory stack/structure. That is, when the magnetization vectors of the "free" magnetic region are in a first state or in a first direction (for example, in the same direction as the direction of the magnetization vectors of the "fixed" magnetic region), the magnetoresistive memory stack/structure has a first magnetic state, which may correspond to a low electrical resistance state. Conversely, when the magnetization vectors of the "free" magnetic region are in a second state or in a second direction (for example, in a direction that is different from (e.g., opposite to) the direction of the magnetization vectors of the "fixed" magnetic region), the magnetoresistive memory stack/structure has a second magnetic state, which may correspond to a high electrical resistance state. The magnetic state of the magnetoresistive memory stack/structure is determined or read based on the resistance of the stack/structure in response to a read current of a read operation. As those of ordinary skill will understand, the read current may be applied through the magnetoresistive memory stack/structure.

It should be noted that, although exemplary embodiments are described and/or illustrated herein in the context of MTJ stacks/structures, the present inventions may also be implemented in giant magnetoresistive (GMR) stacks/structures where a conductor (e.g., copper) is disposed between two ferromagnetic regions/layers/materials. Indeed, the present inventions may be employed in connection with other types of magnetoresistive stacks/structures wherein such stacks/structures include a fixed magnetic region. For the sake of brevity, the discussions and illustrations will not be repeated specifically in the context of GMR or other magnetoresistive stacks/structures—but such discussions and illustrations are to be interpreted as being entirely applicable to GMR and other stacks/structures.

BRIEF DESCRIPTION OF THE DRAWINGS

Embodiments of the present disclosure may be implemented in connection with aspects illustrated in the attached drawings. These drawings show different aspects of the present inventions and, where appropriate, reference numerals illustrating like structures, components, materials, and/or elements in different figures are labeled similarly. It is understood that various combinations of the structures, components, and/or elements, other than those specifically shown, are contemplated and are within the scope of the present inventions.

For simplicity and clarity of illustration, the figures depict the general structure and/or manner of construction of the various embodiments. For ease of illustration, the figures depict the different layers/regions of the illustrated stacks as having a uniform thickness and well-defined boundaries with straight edges. However, a person skilled in the art would recognize that, in reality, the different layers typically have a non-uniform thickness. And, at the interface between adjacent layers, the materials of these layers may alloy together, or migrate into one or the other material, making their boundaries ill-defined. Descriptions and details of well-known features (e.g., interconnects, etc.) and techniques may be omitted to avoid obscuring other features. Elements in the figures are not necessarily drawn to scale. The dimensions of some features may be exaggerated relative to other features to improve understanding of the exemplary embodiments. Cross-sectional views are simplifications provided to help illustrate the relative positioning of various regions/layers and describe various processing steps. One skilled in the art would appreciate that the cross-sectional views are not drawn to scale and should not be viewed as representing proportional relationships between different regions/layers. Moreover, while certain regions/layers and features are illustrated with straight 90-degree edges, in actuality or practice such regions/layers may be more "rounded" and gradually sloping.

Further, one skilled in the art would understand that, although multiple layers with distinct interfaces are illustrated in the figures, in some cases, over time and/or exposure to high temperatures, materials of some of the layers may migrate into or interact with materials of other layers to present a more diffuse interface between these layers. It should be noted that, even if it is not specifically mentioned, aspects described with reference to one embodiment may also be applicable to, and may be used with, other embodiments.

Moreover, there are many embodiments described and illustrated herein. The present disclosure is neither limited to any single aspect nor embodiment thereof, nor to any combinations and/or permutations of such aspects and/or embodiments. Moreover, each aspect of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended to reflect or indicate the embodiment(s) is/are "example" embodiment(s). Further, even though the figures and the written disclosure appear to describe the disclosed magnetoresistive stacks/structures in a particular order of construction (e.g., from bottom to top), it is understood that the depicted magnetoresistive stacks/structures may have the opposite order (e.g., from top to bottom). For example, a "fixed" magnetic region may be formed on or above a "free" magnetic region or layer, which in turn may be formed on or above an intermediate layer or another insertion layer of the present disclosure.

Figure 1:
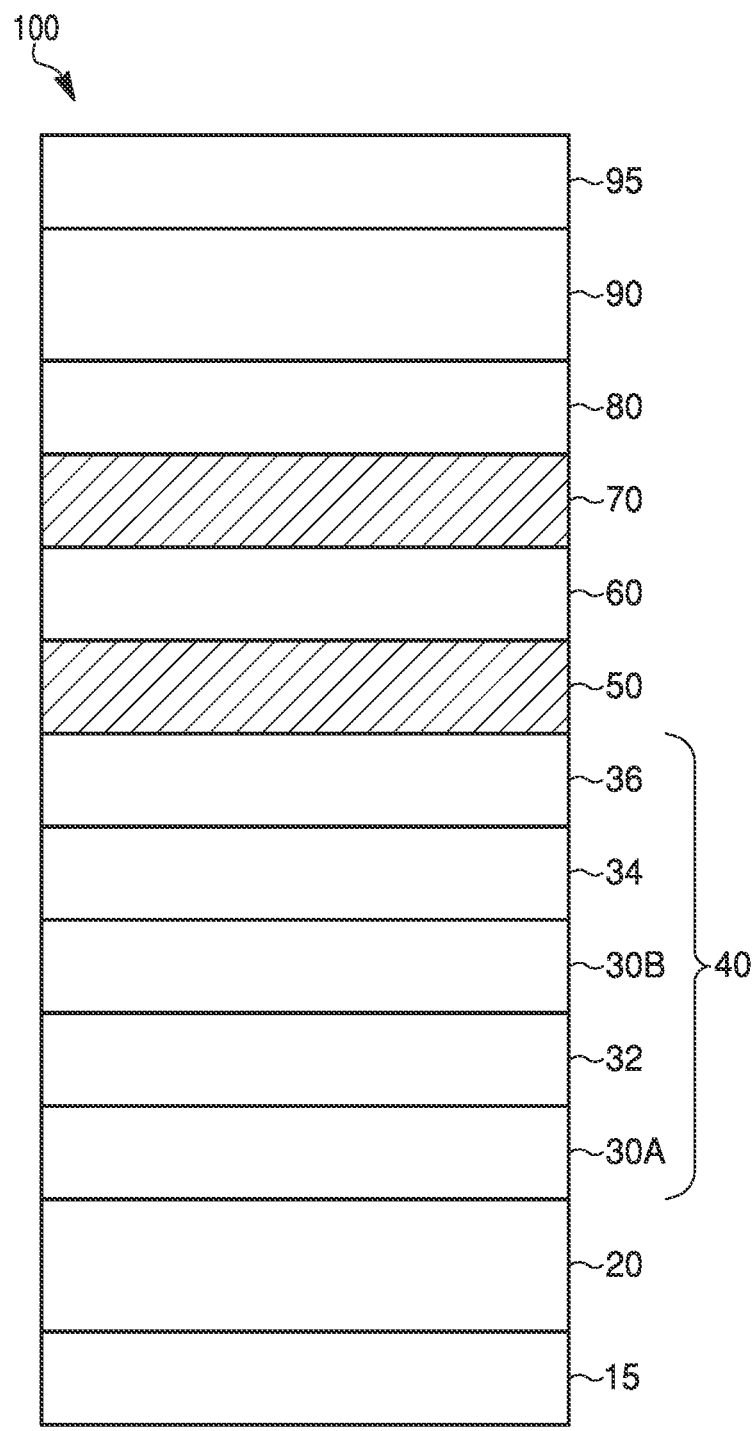

FIG. 1 illustrates a cross-sectional view of layers of an exemplary MTJ-type magnetoresistive stack/structure (for example, an in-plane or out-of-plane magnetic anisotropy magnetoresistive stack/structure (e.g., a perpendicular magnetic anisotropy magnetoresistive stack/structure)) including an intermediate layer, such as, for example, a dielectric layer, disposed between a "free" magnetic layer (or region) and a "fixed" magnetic layer (or region) wherein, in some exemplary embodiments, the "fixed" magnetic layer may be disposed between an electrode and a dielectric layer (which may be a tunnel barrier in the completed structure), according to at least certain aspects of certain embodiments of the present inventions; in this exemplary embodiment, the MTJ-type magnetoresistive stack/structure is disposed between and in physical contact with electrically conductive electrodes/vias/lines made of (for example, in the context of electrodes or vias, tantalum (Ta), or an alloy thereof (e.g., a tantalum-nitride (TaN) alloy), or a composite thereof (e.g., a tantalum (Ta) and tantalum-nitride (TaN) alloy composite)); notably, the "free" magnetic layer and the "fixed" magnetic layer may each include a plurality of layers of magnetic or non-magnetic material(s) (for example, nickel (Ni), iron (Fe), cobalt (Co), palladium (Pd), platinum (Pt), magnesium (Mg), manganese (Mn), chromium (Cr), and alloys thereof) as well as one or more synthetic antiferromagnetic structures (SAF) or synthetic ferromagnetic structures (SyF), wherein one or more layers of magnetic materials layers may also include one or more non-magnetic materials layers (for example, ruthenium (Ru), copper (Cu), aluminum (Al), tantalum (Ta), titanium (Ti), niobium (Nb), vanadium (V), zirconium (Zr), and one or more alloys thereof, and in certain embodiments, tungsten (W) and molybdenum (Mo)); moreover, the dielectric layers may be one or more layers of, for example, an aluminum oxide (e.g., $Al_2O_3$) and/or magnesium oxide (MgO).

Figure 2:
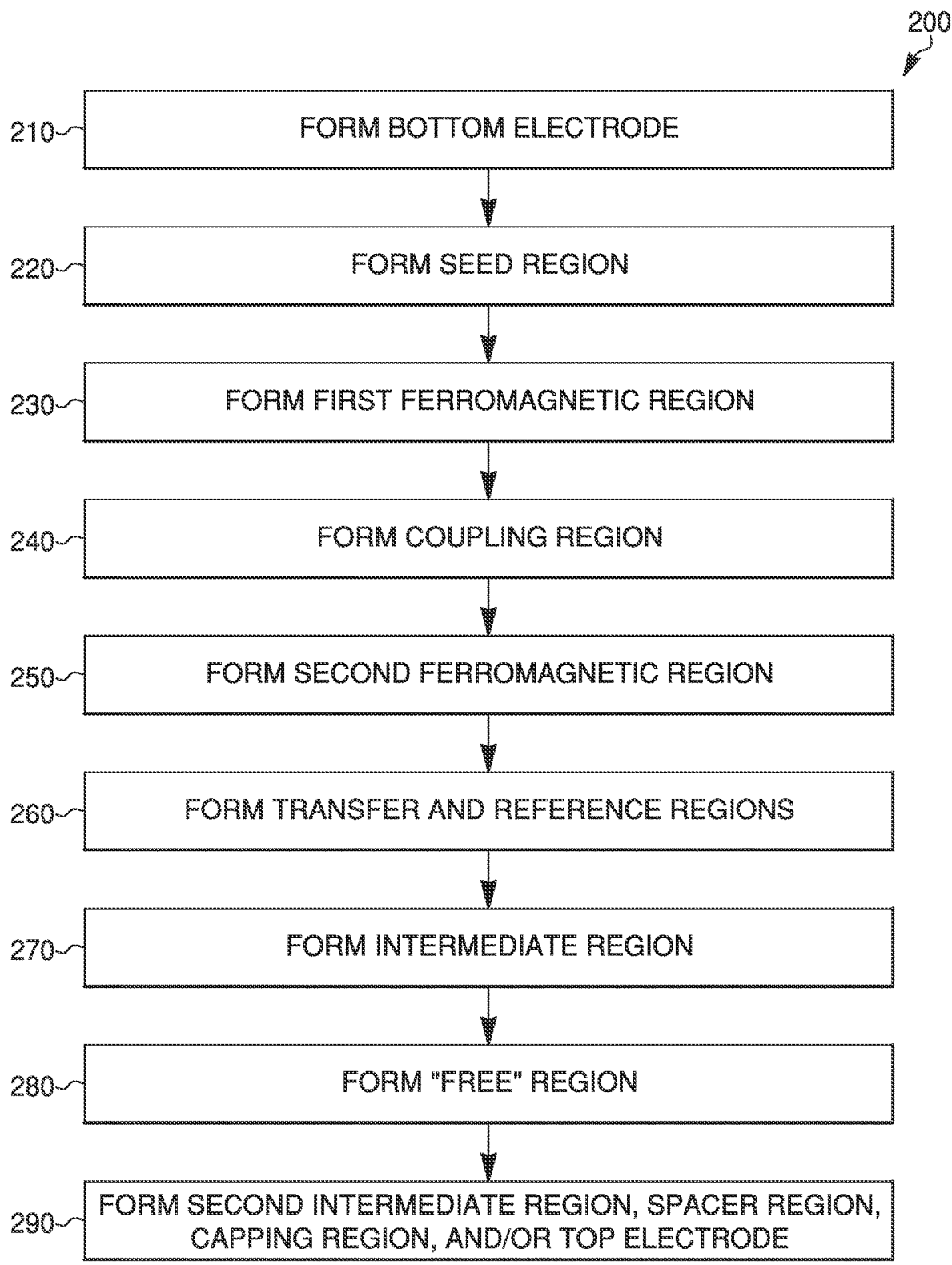

FIG. 2 depicts a flowchart of a simplified exemplary fabrication process of the exemplary MTJ-type magnetoresistive stack/structure illustrated in FIG. 1.

Figure 3A:
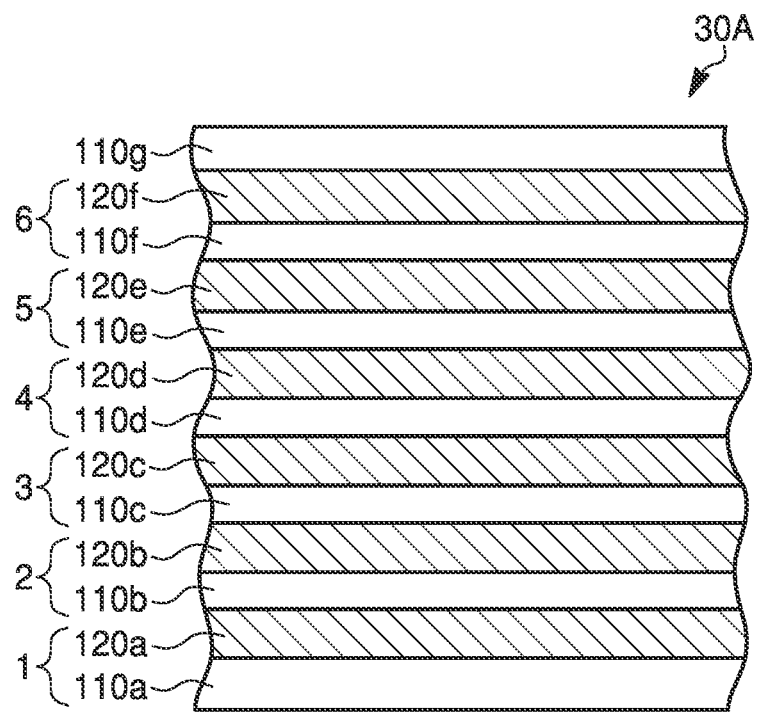

FIG. 3A illustrates a cross-sectional view of exemplary layers that may be included in an exemplary ferromagnetic region of the "fixed" magnetic region of the exemplary MTJ-type magnetoresistive stack/structure illustrated in FIG. 1.

Figure 3B:
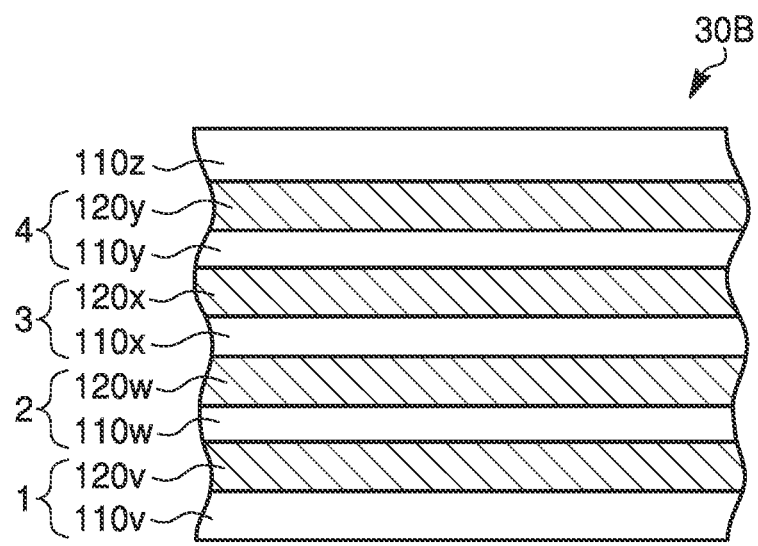

FIG. 3B illustrates a cross-sectional view of exemplary layers that may be included in another exemplary ferromagnetic region of the "fixed" magnetic region of the exemplary MTJ-type magnetoresistive stack/structure illustrated in FIG. 1.

Figure 4:
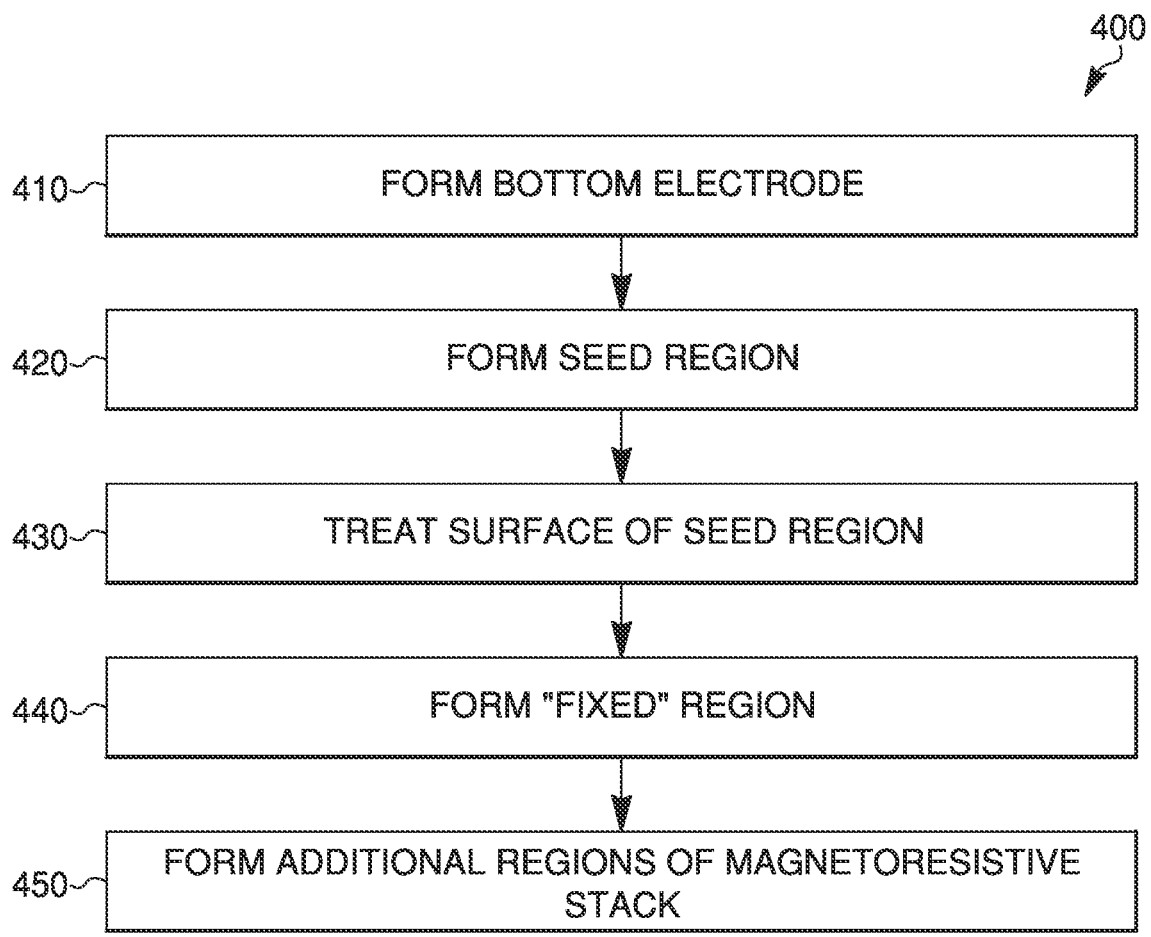

FIG. 4 depicts a flowchart of another simplified exemplary fabrication process of the exemplary MTJ-type magnetoresistive stack/structure illustrated in FIG. 1 comprising a surface-treated seed region 20'.

FIGS. 5A-5E are schematic illustrations of the exemplary MTJ-type magnetoresistive stack/structure at various stages of the fabrication process depicted in FIG. 4.

Figure 6:
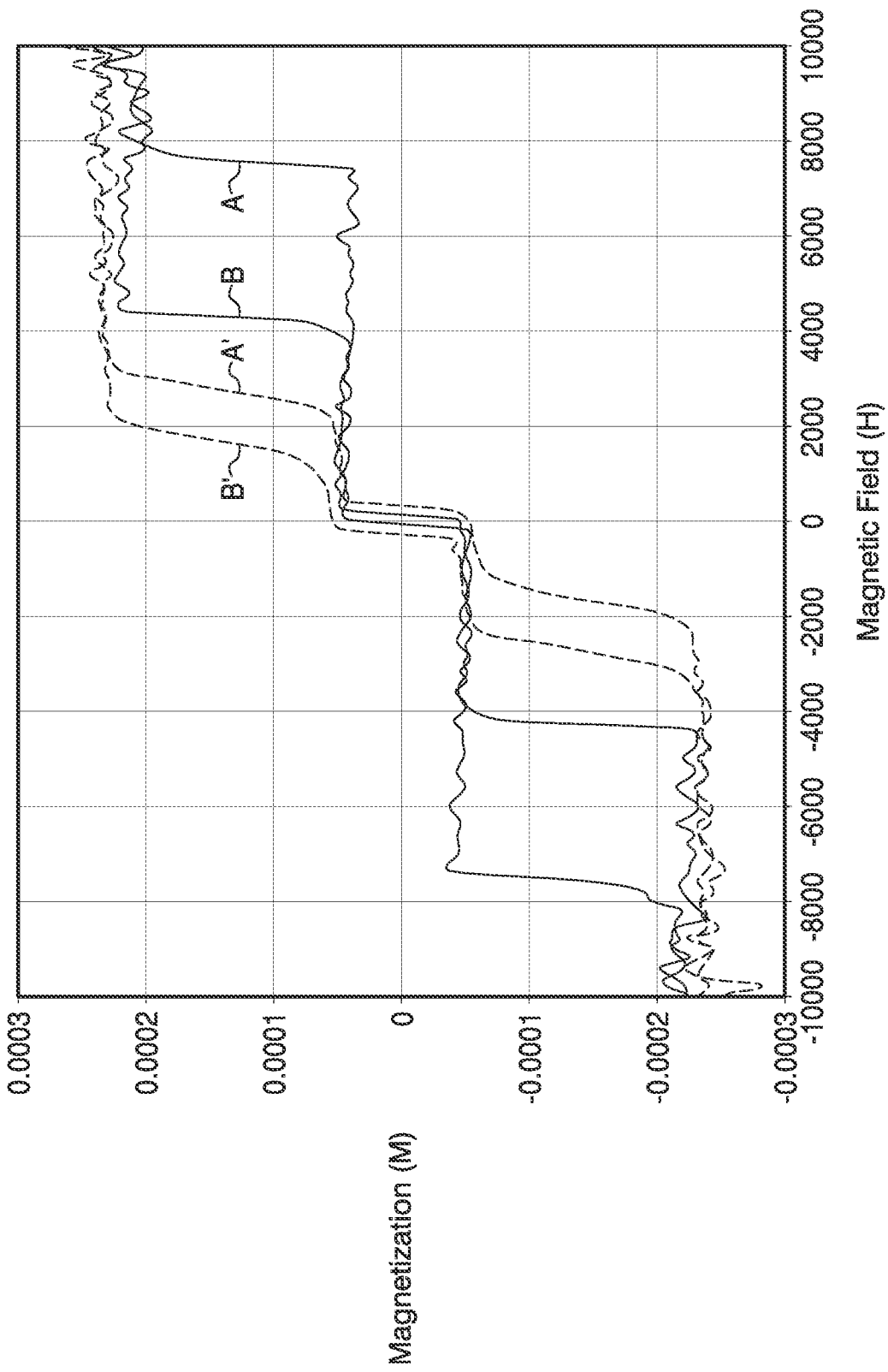

FIG. 6 is a plot showing the observed magnetization versus magnetic field hysteresis loop of a baseline test sample and a surface-treated test sample.

Figure 7:
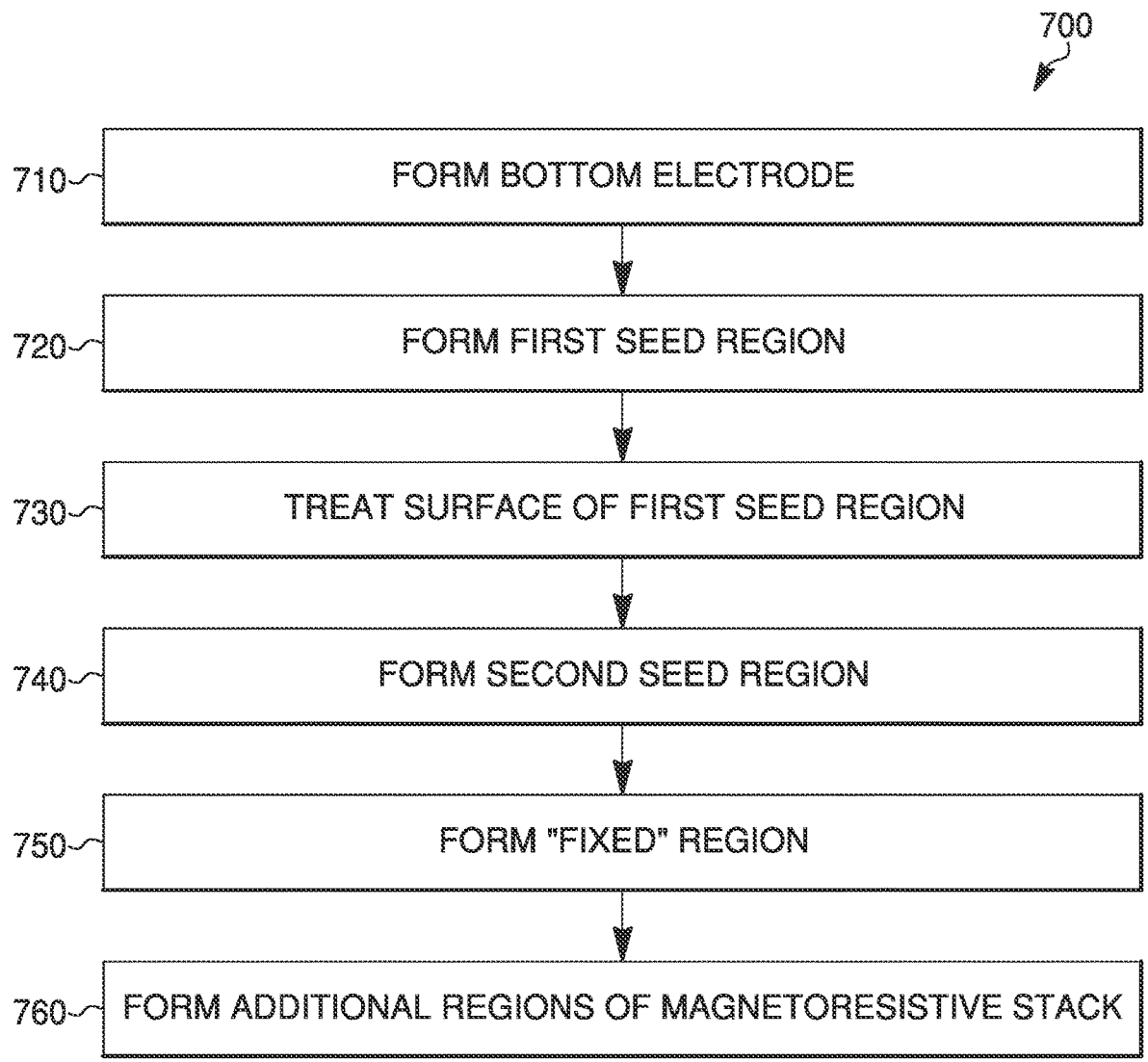

FIG. 7 depicts a flowchart of another simplified exemplary fabrication process of the exemplary MTJ-type magnetoresistive stack/structure illustrated in FIG. 1 comprising an interior surface-treated seed region 20a.

FIGS. 8A-8F are schematic illustrations of the exemplary MTJ-type magnetoresistive stack/structure of FIG. 7 at various stages of the fabrication process.

FIGS. 9A-9E are plots showing the observed magnetization versus magnetic field hysteresis loops of a baseline test sample and interior surface-treated test samples of varying dimensions.

FIGS. 10A-10D are experimental results comparing magnetic parameters of magnetoresistive devices without surface treatment (e.g., FIG. 2), with surface treatment (e.g., FIG. 4), and with interior surface treatment (e.g., FIG. 7).

Figure 11:
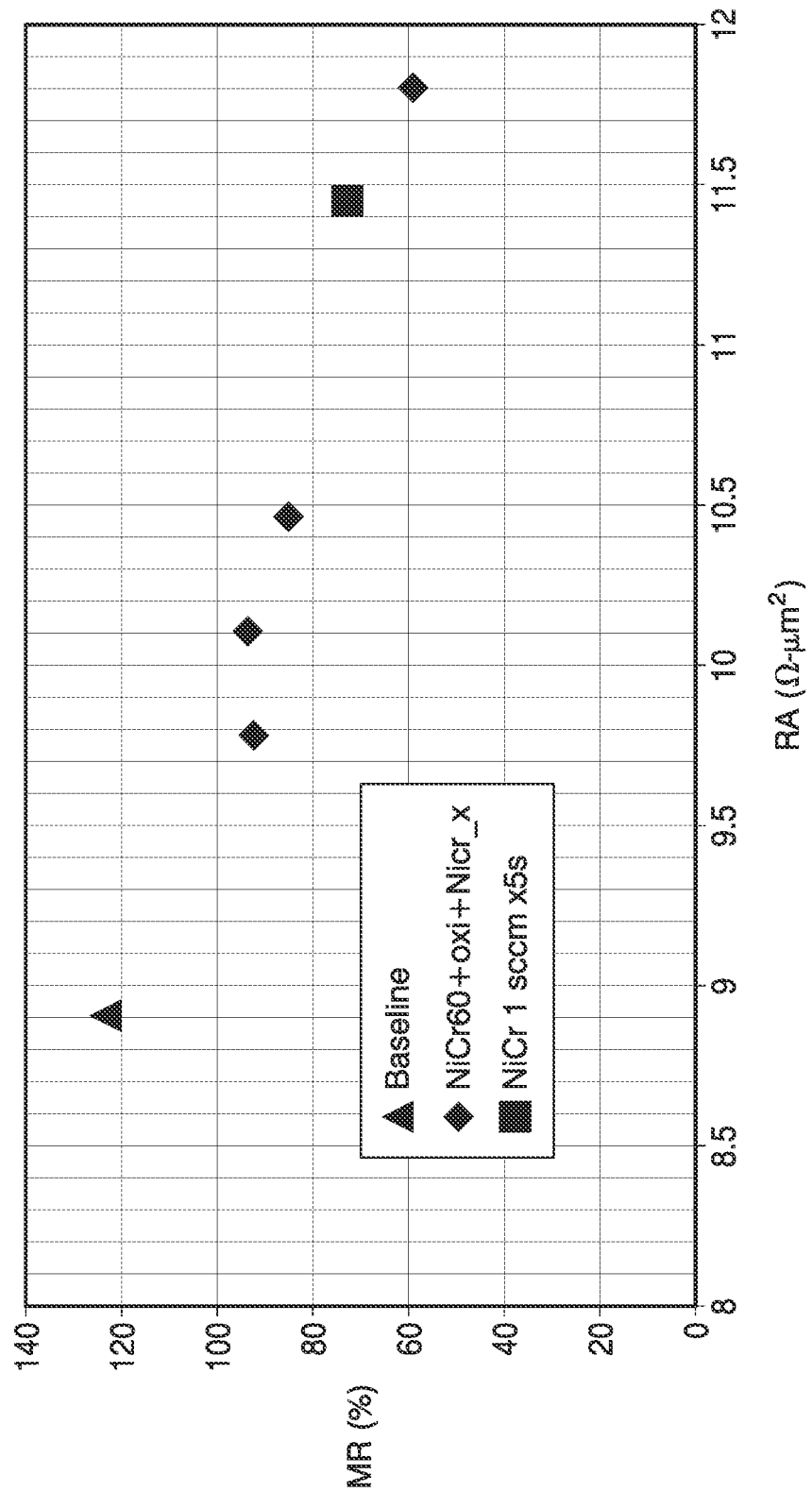

FIG. 11 is a plot comparing observed electrical properties, magnetoresistance (MR) and resistance-area product (RA), of a baseline test sample, a surface-treated test sample, and interior surface-treated test samples of varying dimensions.

Figure 12:
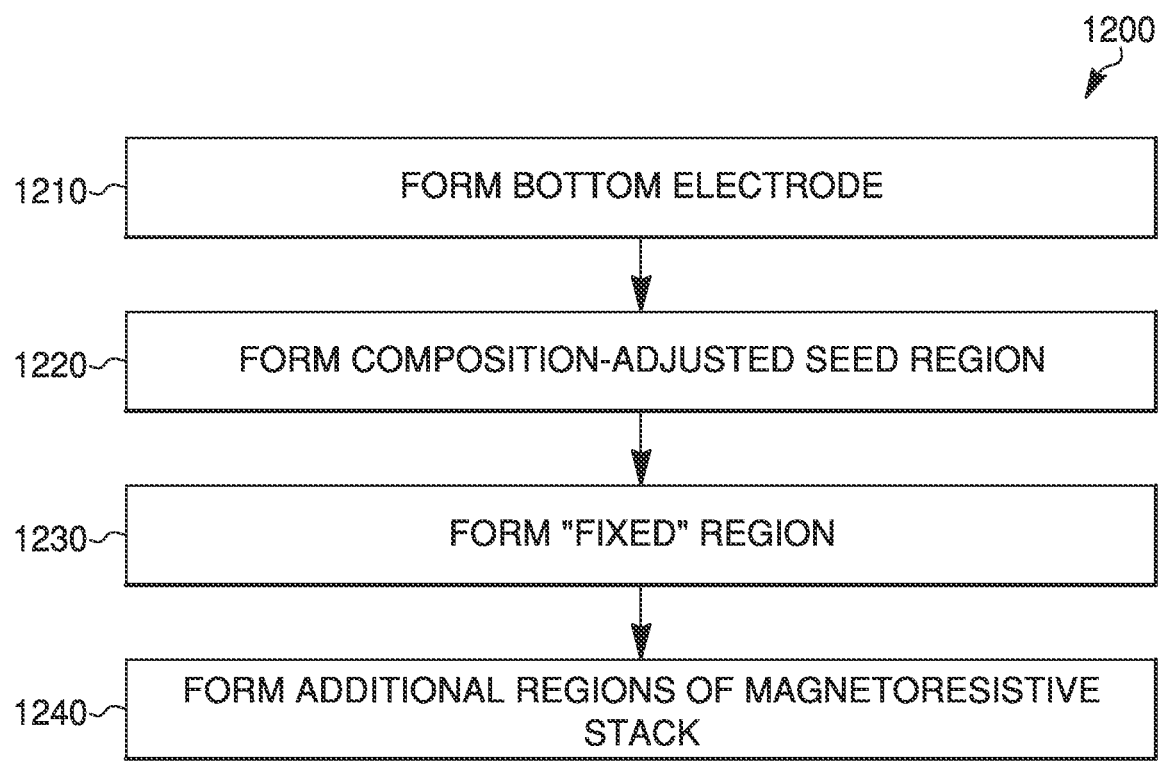

FIG. 12 depicts a flowchart of another simplified exemplary fabrication process of the exemplary MTJ-type magnetoresistive stack/structure illustrated in FIG. 1 comprising a composition-adjusted seed region 25.

FIGS. 13A-13D are schematic illustrations of the exemplary MTJ-type magnetoresistive stack/structure of FIG. 12 at various stages of the fabrication process.

Figure 14:
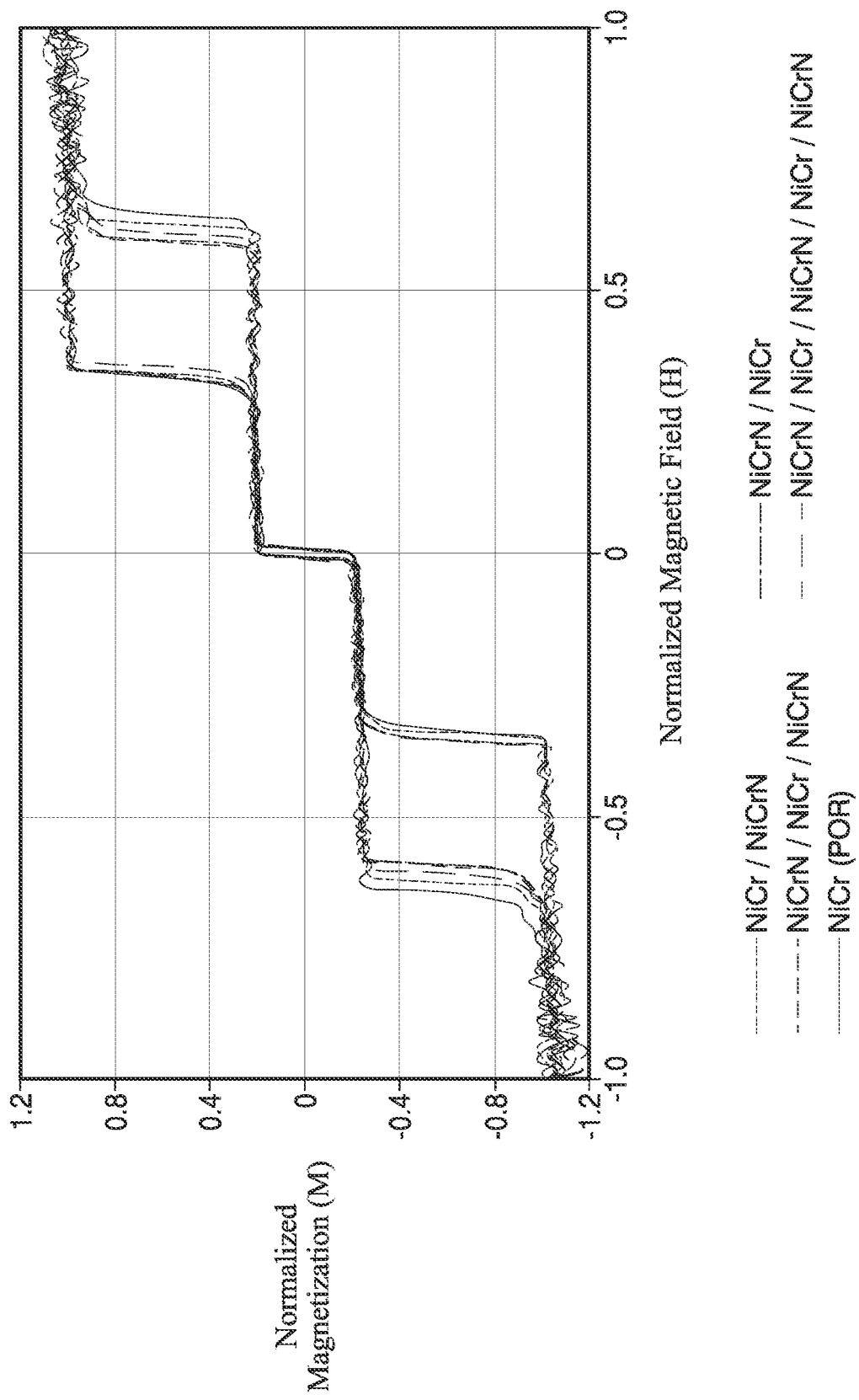

FIG. 14 is a plot showing the observed magnetization versus magnetic field hysteresis loop of a baseline test sample and various composition-adjusted test samples.

Figure 15A:
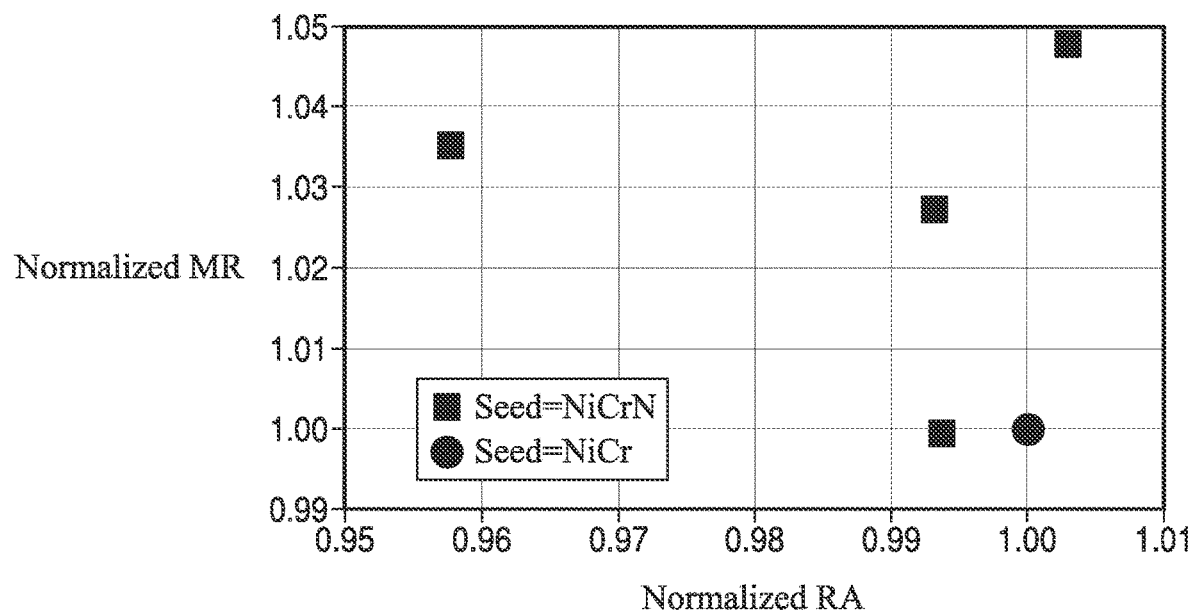

FIG. 15A is a plot comparing observed electrical properties, magnetoresistive (MR) and resistance-area product (RA), of a baseline test sample and a composition-adjusted test sample.

Figure 15B:
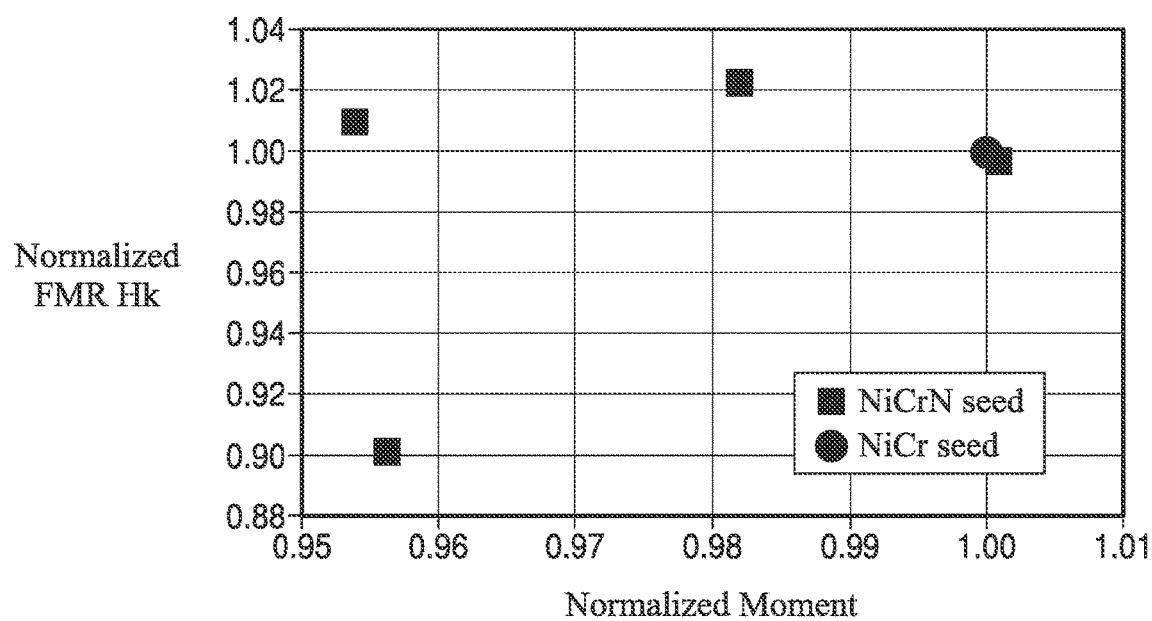

FIG. 15B is an experimental result comparing magnetic parameters, perpendicular anisotropy field (Hk) and magnetic moment, of a baseline test sample and a composition-adjusted test sample.

Figure 16:
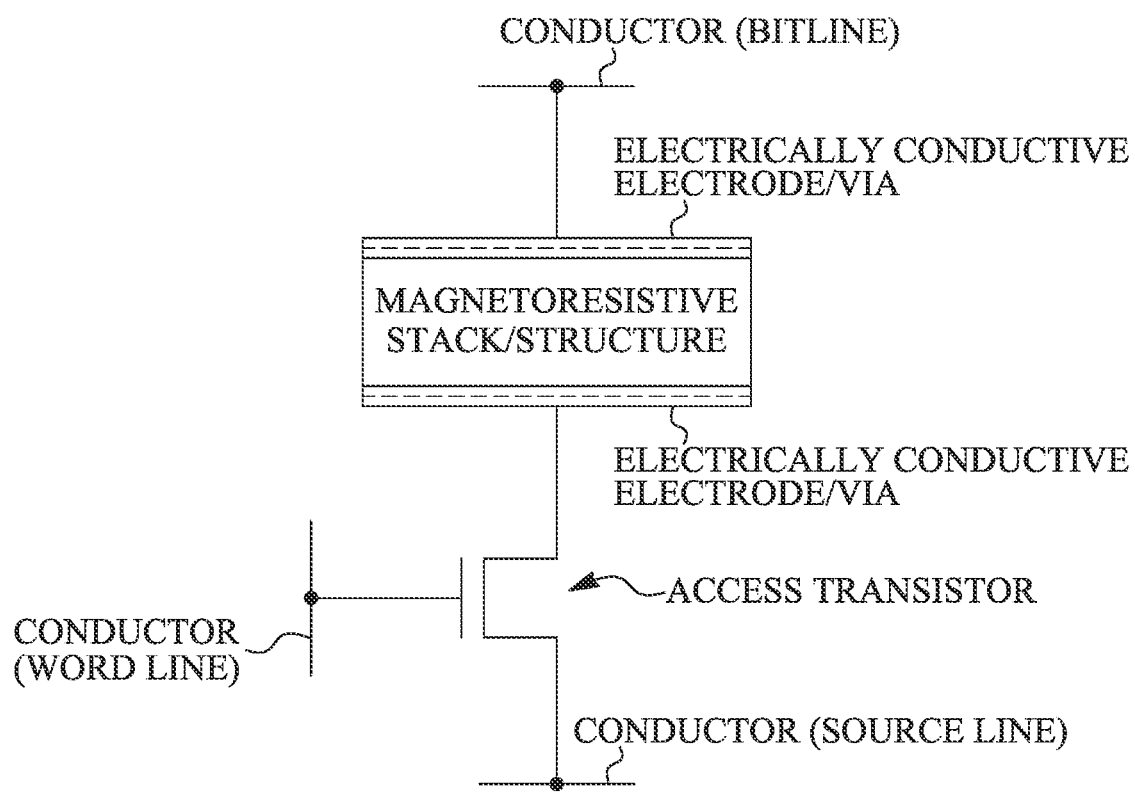
Figure 17A:
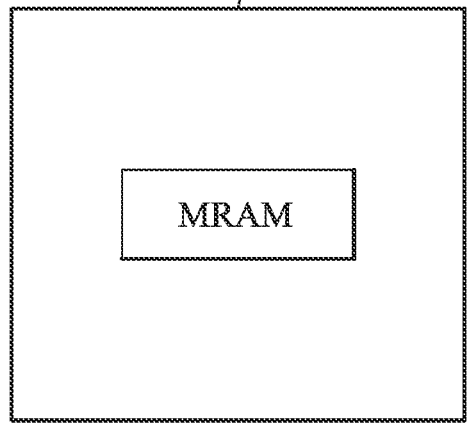
Figure 17B:
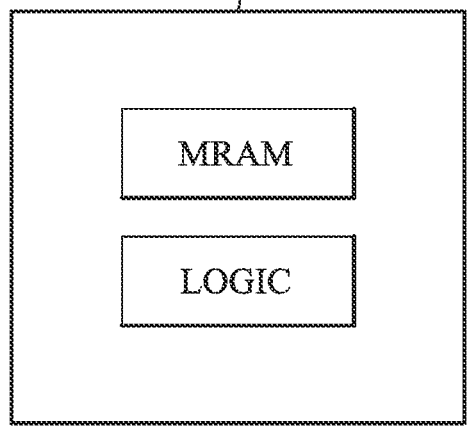

FIG. 16 is a schematic diagram of an exemplary magnetoresistive memory stack/structure electrically connected to an access transistor in a magnetoresistive memory cell configuration;

FIGS. 17A-17B are schematic block diagrams of integrated circuits including a discrete memory device and an embedded memory device, each including MRAM (which, in one embodiment is representative of one or more arrays of MRAM having a plurality of magnetoresistive memory stacks/structures, according to aspects of certain embodiments of the present disclosure).

It should be noted that, although individual regions of FIGS. 1, 3A-3B, 5A-5E, 8A-8F, and 13A-13D are illustrated as distinct layers with sharp, well-defined boundaries, typically, the materials of two adjacent layers at an interface (between the layers) may diffuse into each other, and present an interfacial region of an alloy or a combination of the materials of the two individual layers. Further, while all of the layers or regions of these figures may be present and distinguishable immediately after formation of these regions, in some embodiments, it may be difficult to distinguish some of these regions in a cross-section. In some embodiments, some of these layers may appear as an interfacial region having a higher concentration of an element or a material.

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

It should be noted that all numeric values disclosed herein (including all disclosed thickness values, limits, and ranges) may have a variation of ±10% (unless a different variation is specified) from the disclosed numeric value. For example, a layer disclosed as being "t" units thick can vary in thickness from (t−0.1t) to (t+0.1t) units. Further, all relative terms such as "about," "substantially," "approximately," etc. are used to indicate a possible variation of ±10% (unless noted otherwise or another variation is specified). Moreover, in the claims, values, limits, and/or ranges of thicknesses and atomic compositions of, for example, the described layers/regions, mean the value, limit, and/or range ±10%. It should be noted that the exemplary thickness values discussed in this disclosure are expected values (i.e., not measured values) of layer thicknesses immediately after deposition (based on deposition conditions, etc.). As a person of ordinary skill in the art would recognize, these as-deposited thickness values of a layer or region may change (e.g., by inter-layer diffusion, etc.) after further processing (e.g., exposure to high temperatures, etc.).

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device and method. Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described. Moreover, the terms "a" and "an" herein do not denote a limitation of quantity, but rather denote the presence of at least one of the referenced item.

In this disclosure, the term "region" is used generally to refer to one or more layers. That is, a "region" as used herein may include a single layer (or coating) of material or multiple layers of materials stacked one on top of another to form a multi-layer system. Further, although in the description below, the different regions in the disclosed stack/structure are referred to by specific names (e.g., capping region, reference region, transition region, etc.), this is only for ease of description and not intended as a functional description of the layer.

As alluded to above, in one exemplary aspect, the magnetoresistive stack/structure of the present disclosure may be implemented as a spin-torque magnetoresistive random access memory ("MRAM") element ("memory element"). In such aspects, the stack/structure may include an intermediate region positioned (or sandwiched) between two ferromagnetic regions to form a magnetic tunnel junction (MTJ) device or an MTJ-type device. The intermediate region may be a tunnel barrier and may include an insulating material, such as, e.g., a dielectric material. In other embodiments, the intermediate region may be a conductive material, e.g., copper, gold, or alloys thereof. In these other embodiments, where the magnetoresistive stack/structure includes a conductive material in between two ferromagnetic regions, the magnetoresistive stack/structure may form a GMR or GMR-type device.

Of the two ferromagnetic regions disposed on either side of the intermediate region, one ferromagnetic region may be a magnetically "fixed" or pinned region, and the other ferromagnetic region may be a magnetically "free" region. As alluded to above, the term "free" is intended to refer to ferromagnetic regions having a magnetic moment that may shift or move significantly in response to applied magnetic fields or spin-polarized currents used to switch the magnetic moment vector. On the other hand, the words "fixed" and "pinned" are used to refer to ferromagnetic regions having a magnetic moment vector that does not move substantially in response to such applied magnetic fields or spin-polarized currents. As is known in the art, an electrical resistance of the described magnetoresistive stack/structure may change based on whether the magnetization direction (e.g., the direction of the magnetic moment) of the "free" region is in a parallel alignment or in an antiparallel alignment with the magnetization direction (e.g., the direction of the magnetic moment) of the "fixed" region. Typically, if the two regions have the same magnetization alignment, the resulting relatively low(er) resistance is considered as a digital "0," while if the alignment is antiparallel the resulting relatively higher resistance is considered to be a digital "1." A memory device (such as an MRAM) may include multiple such magnetoresistive stacks/structures, which may be referred to as memory cells or elements, arranged in an array of columns and rows. By measuring the current through each cell, the resistance of each cell, and thus the data stored in the memory array can be read.

Switching the magnetization direction of the "free" region of a magnetoresistive stack/structure may be accomplished by driving an electrical current pulse through the magnetoresistive stack/structure or otherwise applying a current that generates a spin-orbit-torque (SOT). The polarity of the current pulse determines the final magnetization state (e.g., parallel or antiparallel) of the "free" region. The mean current required to switch the magnetic state of the "free" region may be referred to as the critical current (Ic). The critical current is indicative of the current required to "write" data in (or the write current of) a magnetoresistive memory cell. In some embodiments, the write current may be a function of the critical current. For example, in the embodiments contemplated herein, the write current may be approximately 1.3 or 1.4 times of the critical current. Reducing the required write current(s) is desirable so that, among other things, a smaller access transistor can be used for each memory cell and a higher density, lower cost memory can be produced.

Magnetoresistance ratio (MR) is the ratio of the change in resistance of a magnetoresistive stack/structure between its "high" and "low" resistance states (MR=$(R_H-R_L)/R_L$, where $R_L$ and $R_H$ are the magnetoresistive stack/structure resistance in the low and high resistance states, respectively). MR is indicative of the strength of the signal when a memory element is "read." For an MTJ-type magnetoresistive stack/structure with a strong read signal, a larger MR (i.e., a larger difference between the individual resistances $R_H$ and $R_L$) is desirable. When the intermediate region of magnetoresistive stack/structure is a tunnel barrier made of a dielectric material, the resistance may be measured by the resistance-area product (RA). Embodiments of the present disclosure relate to methods and apparatus that increase RA with a small decrease in MR, for improving reliability and endurance of a magnetoresistive device.

For the sake of brevity, conventional techniques related to semiconductor processing may not be described in detail herein. The exemplary embodiments may be fabricated using known lithographic processes. The fabrication of integrated circuits, microelectronic devices, micro electro mechanical devices, microfluidic devices, and photonic devices involves the creation of several layers of materials that interact in some fashion. One or more of these layers may be patterned so various regions of the layer(s) have different electrical or other characteristics, which may be interconnected within the layer or to other layers to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or not exposed to the radiation, is removed by the application of a developer. An etch may then be employed/applied whereby the layer not protected by the remaining resist is patterned. Alternatively, an additive process can be used in which a structure is built up using the photoresist as a template.

As noted above, in one aspect, the described embodiments relate to, among other things, methods of manufacturing a magnetoresistive stack/structure having one or more electrically conductive electrodes, vias, or conductors on either side of a magnetic material stack. As described in further detail below, the magnetic material stack/structure may include many different layers of materials, where some of the layers include magnetic materials, whereas others do not. In one embodiment, the methods of manufacturing include sequentially depositing, growing, sputtering, evaporating, and/or providing (as noted above, herein collectively "depositing" or other verb tense (e.g., "deposit" or "deposited")) layers and regions which, after further processing (for example, etching), form a magnetoresistive stack/structure.

The magnetoresistive stacks/structures of the present inventions may be formed between a top electrode/via/line (e.g., electrode 95 in FIG. 1) and a bottom electrode/via/line (e.g., electrode 15 in FIG. 1), which permit access to the stack/structure by allowing for connectivity (for example, electrical) to circuitry and other elements of the magnetoresistive device. Between the electrodes/vias/lines are regions (i.e., each region made of one or more layers), including at least one "fixed" magnetic region (which includes, among other things, a plurality of ferromagnetic layers), a seed region (which in at least one embodiment is disposed between the electrically conductive electrode/via/line and the at least one "fixed" magnetic region), at least one "free" magnetic region (which includes, among other things, a plurality of ferromagnetic layers), and one or more dielectric regions disposed between the "fixed" magnetic region and the "free" magnetic region, to provide an intermediate region (e.g., a tunnel barrier layer) therebetween. In some embodiments, the top electrode (and/or the bottom electrode) may be eliminated, and a bit line may be formed on top of the stack.

FIG. 1 is a cross-sectional view of regions (or layers) of an exemplary MTJ-type magnetoresistive stack/structure 100 (for example, an in-plane or out-of-plane magnetic anisotropy magnetoresistive stack/structure (e.g., a perpendicular magnetic anisotropy magnetoresistive stack/structure)). It will be recognized that several other commonly-used regions (or layers) (e.g., various protective cap layers, seed layers, underlying substrate, etc.) have not been illustrated in FIG. 1 (and in subsequent figures) for clarity. As illustrated in FIG. 1, magnetoresistive stack/structure 100 includes multiple regions arranged one over the other to form a stack/structure between a first electrode 15 and a second electrode 95. As shown in FIG. 1, first electrode 15 may be a "bottom" electrode, and second electrode 95 may be a "top" electrode. However, those of ordinary skill in the art will recognize that the relative order of the various regions of magnetoresistive stack/structure 100 may be reversed. For example, first electrode 15 may be a top electrode and second electrode 95 may be a bottom electrode. Further, in some embodiments, the top electrode (and/or the bottom electrode) may be eliminated, and a bit line may be formed on top of the stack. The bottom and top electrodes 15, 95 may comprise an electrically conductive material, and may be part of (or be in physical contact with) electrically conductive interconnects (e.g., vias, traces, lines, etc.) of magnetoresistive stack/structure 100. Although any electrically conductive material may be used for bottom and top electrodes 15, 95, in some embodiments, a metal such as tantalum (Ta), titanium (Ti), tungsten (W), or a composite or alloy of these elements (e.g., tantalum-nitride alloy) may be used.

With continuing reference to FIG. 1, "fixed" region 40 may be formed on or above bottom electrode 15. Although not illustrated in FIG. 1, in some embodiments, bottom electrode 15 may be formed on a planar surface of a semiconductor substrate (e.g., a semiconductor substrate having transistors, etc. formed thereon or therein). "Fixed" region 40 may serve as a "fixed" magnetic region of magnetoresistive stack/structure 100. That is, a magnetic moment vector in the "fixed" region 40 does not move significantly in response to applied magnetic fields (e.g., an external field) or applied currents used to switch the magnetic moment vector of "free" region 60, as explained above. In some embodiments, a seed region 20 may be disposed between bottom electrode 15 and "fixed" region 40. Seed region 20 may facilitate the formation of "fixed" region 40 on bottom electrode 15. In embodiments where bottom electrode 15 provides the desired growth characteristics for the subsequent layers, seed region 20 may be omitted. Though seed region 20 is depicted as a single layer, those of ordinary skill in the art will understand that seed region 20 may also include a multi-layer structure. Seed region 20 may comprise one or more of nickel (Ni), chromium (Cr), cobalt (Co), iron (Fe), and alloys thereof (for example, an alloy including nickel (Ni) and/or chromium (Cr)) having a thickness which is greater than or equal to approximately 30 Å, or greater than or equal to approximately 40 Å, or greater than or equal to approximately 50 Å, or preferably greater than or equal to approximately 60 Å, or more preferably greater than or equal to approximately 40 Å or approximately 50 Å and less than or equal to approximately 100 Å (for example, approximately 40 Å to approximately 60 Å), or even more preferably greater than or equal to approximately 60 Å and less than or equal to approximately 100 Å, or most preferably approximately 60 Å+/−10%. In some embodiments, as depicted in FIG. 1, seed region 20 may be disposed between and in physical contact with bottom electrode 15 (or an electrically conductive metal of an electrode/via/line) and "fixed" magnetic region 40.

Turning now to "fixed" region 40, an exemplary embodiment of "fixed" region 40 comprising a plurality of stacked regions is illustrated in FIG. 1. It should be noted that, for the sake of clarity, only certain regions that comprise the "fixed" region 40, and only certain exemplary regions on either side of the "fixed" region 40 (e.g., bottom electrode 15 and intermediate region 50) are illustrated in FIG. 1. Those of ordinary skill in the art will readily recognize that one or more additional layers, interface areas, and/or regions may be included within "fixed" region 40 and/or may be disposed between the layers of "fixed" region 40 and the depicted exemplary regions on either side of "fixed" region 40. In general, "fixed" region 40 may have any thickness. In some embodiments, the "fixed" region 40 may have a thickness in the range of approximately 8 Å to approximately 300 Å, approximately 15 Å to approximately 110 Å, greater than or equal to 8 Å, greater than or equal to 15 Å, less than or equal to 300 Å, or less than or equal to 110 Å. "Fixed" region 40 may be deposited or formed using any technique now known or later developed; all of which are intended to fall within the scope of the present disclosure. In some embodiments, "fixed" region 40 may include one or more synthetic antiferromagnetic structures (SAF) or synthetic ferromagnetic structures (SyF). Since SAFs and SyFs are known to those of ordinary skill in the art, additional description is omitted for sake of brevity.

In some embodiments, "fixed" region 40 may be a fixed, unpinned synthetic antiferromagnetic (SAF) structure, which may include at least two ferromagnetic regions 30A, 30B separated by an antiferromagnetic (AF) coupling region 32. Ferromagnetic regions 30A and 30B may sometimes be referred to as Anti-Parallel layer 1 (AP1) and Anti-Parallel layer 2 (AP2), respectively. In some embodiments, at least one of the ferromagnetic regions 30A, 30B (i.e., AP1 and/or AP2) may include a multi-layer structure that includes a plurality of layers of (i) a first ferromagnetic material (e.g., cobalt (Co)) and (ii) a second ferromagnetic material (e.g., nickel (Ni)) or a paramagnetic material (e.g., platinum (Pt), palladium (Pd), etc.). "Fixed" magnetic region 40 may also include a transition region 34 and/or a reference region 36 disposed between ferromagnetic region 30B and intermediate region 50, which as noted above may include a layer of dielectric material (forming a tunnel barrier) in the MTJ structure. In some embodiments, as shown in FIG. 1, both transition region 34 and reference region 36 may be provided, while in other embodiments, only one of transition region 34 or reference region 36 may be provided. Transition region 34 and/or reference region 36 may include one or more layers of materials that, among other things, may facilitate/improve the growth (or formation) of intermediate region 50 during fabrication. In some embodiments, reference region 36 may include one or more or all of cobalt (Co), iron, (Fe), and boron (B) (for example, in an alloy—such as an amorphous alloy (e.g., CoFeB, CoFeBTa, CoFeTa, etc.)), and transition region 34 may include a non-ferromagnetic transition metal such as tantalum (Ta), titanium (Ti), tungsten (W), ruthenium (Ru), niobium (Nb), zirconium (Zr), hafnium (Hf), molybdenum (Mo), etc.

In some embodiments, reference region 36 also may include a multi-layer structure. For example, reference region 36 may include a layer of iron (Fe) (for example, deposited as pure or substantially pure iron (Fe)) and a layer of cobalt (Co), iron (Fe), and boron (B) (for example, deposited as an alloy), wherein, after further/final processing (e.g., after annealing), the layer of iron (Fe) at the interface may form a continuous atomic layer or may mix with the underlying ferromagnetic alloy in the final annealed structure, resulting in a high-iron (Fe) interface region within reference region 36 adjacent to intermediate region 50. In some embodiments, transition region 34 may be formed by depositing (or by another process) one or more non-ferromagnetic layers that alloy with one or more of the neighboring ferromagnetic regions (e.g., region 30B), for example, during or in conjunction with a subsequent annealing process to thereby form transition region 34. In some embodiments, an alloy material may be directly deposited as transition region 34 and/or reference region 36. In general, transition region 34 and reference region 36 may have any thickness. In some embodiments, a thickness (t) of transition region 34 may be approximately 1-8 Å, preferably approximately 1.5-5 Å, and more preferably approximately 2.5-3.5 Å. In some embodiments, a thickness (t) of reference region 36 may be approximately 6-13 Å, preferably approximately 8-12 Å, and more preferably approximately 9-9.5 Å. In embodiments where an alloy material is directly deposited as transition region 34, the thickness of the transition region 34 may be approximately 8 Å. In some embodiments, transition region 34 and/or reference region 36 may have sub-atomic thicknesses.

As a person of ordinary skill in the art would recognize, in some cases, after deposition (e.g., over time, after exposure to high temperatures, etc.), the material of the deposited region (e.g., any of the regions or layers described herein) may migrate into (diffuse, etc.) an adjoining region (e.g., underlying region, etc.) to form an alloy. In such embodiments, e.g., although transition and reference regions 34, 36 may appear as distinct layers immediately after formation of these regions, after subsequent processing operations (e.g., annealing), these regions may mix or alloy together to form a single alloyed region with (or separate from) other regions of "fixed" region 40. Thus, in some cases, it may be difficult to distinguish regions 34 and 36 as being separate from other regions in "fixed" region 40 of a finished magnetoresistive stack/structure 100. Instead, a region at the interface of "fixed" region 40 with its overlying region (e.g., region 50 in FIG. 1) may have a greater concentration of the material(s) that forms transition region 34 and reference region 36.

With renewed reference to FIG. 1, a "free" region 60 (or storage region or layer) is arranged atop "fixed" region 40 with an intermediate region 50 positioned between "fixed" region 40 and "free" region 60. In some embodiments, the intermediate region 50 may include a dielectric material and may function as a tunnel barrier. Intermediate region 50 may be formed on or above a surface of "fixed" region 40, and "free" region 60 may be formed on or above a surface of intermediate region 50. In some embodiments, intermediate region 50 may include an oxide material, such as, for example, $MgO_x$ (e.g., MgO) or $AlO_x$ (e.g., $Al_2O_3$), and may be formed by multiple steps of material deposition and oxidation. In general, intermediate region 50 may have any thickness. In some embodiments, intermediate region 50 may have a thickness of approximately 8.5-14.1 Å, preferably between 9.6-13.0 Å, and more preferably between 9.8-12.5 Å.

Although not illustrated in FIG. 1, in some embodiments, "free" region 60 may also include one or more ferromagnetic layers/regions (similar to "fixed" region 20). For example, in some embodiments, "free" region 60 may comprise at last two ferromagnetic regions separated by a coupling region (e.g., including tantalum (Ta), tungsten (W), molybdenum (Mo), ruthenium (Ru), rhodium (Rh), rhenium (Re), iridium (Ir), chromium (Cr), osmium (Os), hafnium (Hf), and their combinations). The coupling region may provide either ferromagnetic coupling or antiferromagnetic coupling between the ferromagnetic layers/regions of the "free" region 60. Notwithstanding the specific construction of "free" region 60, "free" region 60 may include a magnetic vector (or moment) that can be moved or switched by applied magnetic fields or electrical currents. "Free" region 60 may be formed from any ferromagnetic material having two or more stable magnetic states. These materials may include alloys of one or more of the ferromagnetic elements nickel (Ni), iron (Fe), cobalt (Co), and boron (B). Additional elements may be added to the alloys to provide improved magnetic, electrical, or microstructural properties. In some embodiments, similar to "fixed" region 40, "free" region 60 also may include one or more SAF or SyF structures. In general, "free" region 60 may have any thickness, such as, for example, approximately 7-40 Å, preferably approximately 20-30 Å, and more preferably approximately 25-28.5 Å.

With continuing reference to FIG. 1, in some embodiments, a second intermediate region 70 may be positioned on or above "free" region 60. Similar to intermediate region 50, intermediate region 70 may also include a dielectric material and may function as a tunnel barrier. In some embodiments, intermediate region 70 may include an oxide material, such as, for example, $MgO_x$ (e.g., MgO) or $AlO_x$ (e.g., $Al_2O_3$). Intermediate region 70 may include the same or a differing material as intermediate region 50. In general, intermediate region 70 may have any thickness. In some embodiments, intermediate region 70 may have a similar thickness as intermediate region 50. In other embodiments, intermediate region 70 may have a greater or less thickness than intermediate region 50. In some embodiments, intermediate region 70 may have a thickness of about 8.5-14.1 Å, preferably about 9.6-13.0 Å, and more preferably about 9.8-12.5 Å. In some embodiments, as illustrated in FIG. 1, a spacer region 80 may be formed on or above intermediate region 70, and a capping region 90 may be formed between spacer region 80 and top electrode 95. It is understood, however, that either of spacer region 80 or capping region 90 may be omitted. Spacer region 80 may be formed of an electrically conductive non-ferromagnetic material, such as, for example, ruthenium (Ru). In some embodiments, spacer region 80 may include a multi-layer stack, such as, for example, a layer of ruthenium (Ru) and one or more layers of cobalt (Co), iron (Fe), boron (B), or an alloy thereof (e.g., CoFeB). Although spacer region 80 may, in general, have any suitable thickness, in some embodiments, spacer region may have a thickness of about 5-35 Å, preferably about 7-30 Å, and more preferably about 10-25 Å. In some embodiments, spacer region 80 may include a layer of ruthenium (Ru) (e.g., having a thickness of about 10-20 Å) and a layer of CoFeB (e.g., having a thickness of about 5-15 Å). Capping region 90 may include any suitable material and thickness. In some embodiments, capping region 90 may be formed of materials such as tantalum (Ta), tungsten (W), titanium (Ti), tantalum nitride (TaN), etc. Although not a requirement, in some embodiments, the thickness of the capping region 90 may be approximately 20-150 Å, or preferably approximately 30-100 Å, or more preferably approximately 40-70 Å.

An exemplary method of fabricating the disclosed magnetoresistive stack 100 will now be described. It should be appreciated that the described methods are merely exemplary. In some embodiments, the methods may include a number of additional or alternative steps, and in some embodiments, one or more of the described steps may be omitted. Any described step may be omitted or modified, or other steps added, as long as the intended functionality of the fabricated magnetoresistive stack/structure remains substantially unaltered. Further, although a certain order is described or implied in the described methods, in general, the steps of the described methods need not be performed in the illustrated and described order. Further, the described methods may be incorporated into a more comprehensive procedure or process having additional functionality not described herein.

FIG. 2 depicts a flow chart of an exemplary method 200 of fabricating magnetoresistive stack/structure 100. In the discussion below, reference will be made to FIG. 1. A bottom electrode 15 may be formed by any suitable process, including, e.g., deposition (step 210). In some embodiments, bottom electrode 15 may be formed on a surface of a substrate that defines a plane or an otherwise substantially planar surface. A seed region 20 may then be formed on or above bottom electrode 15 (step 220). A "fixed" region 40 may then be formed on or above seed region 20. Forming "fixed" region 40 may include forming (e.g., by depositing) a first ferromagnetic region 30A on or above seed region 20 (step 230). A coupling region 32 may then be formed on or above ferromagnetic region 30A (step 240). A second ferromagnetic region 30B may then be formed on or above coupling region 32 (step 250). A transition region 34 and a reference region 36 may then be sequentially formed on or above second ferromagnetic region 30B (step 260). An intermediate region 50 then may be formed on or above region 36 (step 270), and a "free" region 60 may be formed on or above the intermediate region 50 (step 280). Then, a second intermediate region 70, a spacer region 80, a capping region 90, and a top electrode 95 may be sequentially formed atop "free" region 60 (step 290).

It should be noted that the configuration (e.g., structure, etc.) of magnetoresistive stack 100 of FIG. 1 is only exemplary. As those with ordinary skill in the art will recognize, magnetoresistive stack 100 may have many other configurations. For example, in some embodiments, magnetoresistive stack 100 may have a dual spin filter structure in which a second "fixed" region is provided above intermediate region 70. In some embodiments, the second "fixed" region may also have a structure similar to that of "fixed" region 40. Specifically, the second "fixed" region may also include two ferromagnetic regions (AP1, AP2) with a coupling region positioned therebetween. U.S. Pat. Nos. 8,686,484; 8,747,680; 9,023,216; 9,136,464; and 9,419,208, and U.S. patent application Ser. No. 15/831,736 (filed Dec. 5, 2017); 62/671,794 (filed May 15, 2018); 62/591,945 (filed Nov. 29, 2017); 62/594,229 (filed Dec. 4, 2017); 62/580,612 (filed Nov. 2, 2017); 62/582,502 (filed Nov. 7, 2017); and 62/588,158 (filed Nov. 17, 2017), incorporated by reference in their entireties herein, describe exemplary configurations of magnetoresistive stacks and methods of making such magnetoresistive stacks.

As explained previously, ferromagnetic regions 30A and 30B of "fixed" region 40 may include a multi-layer structure. FIG. 3A illustrates an exemplary multilayer structure of ferromagnetic region 30A (i.e., AP1). As illustrated in FIG. 3A, in some embodiments, ferromagnetic region 30A may include multiple alternating layers of two different ferromagnetic materials formed one on top of the other. For example, ferromagnetic region 30A may include a multi-layer stack of alternating layers, namely a magnetic layer 110 and a second metal layer 120. That is, metal layer 120$a$ is formed over a magnetic layer 110$a$ and a further magnetic layer 110$b$ is formed over the metal layer 120$a$, etc. Though the present embodiment contemplates two alternating layers, those of ordinary skill will understand that a greater or lesser number of layers may be repeated as suitable. Magnetic layer 110 may include a ferromagnetic material such as cobalt (Co), iron (Fe), a cobalt based alloy, or an iron based alloy. And, metal layer 120 may include materials such as platinum (Pt), palladium (Pd), nickel (Ni), gold (Au), etc. In some embodiments, magnetic layer 110 may be formed of cobalt (Co) and the second metal layer 120 may be formed of platinum (Pt) (or palladium (Pd)). In general, magnetic layer 110 and metal layer 120 may be stacked to form any number of magnetic layer pairs (marked 1-6 in FIG. 3A). Each layer pair includes a metal layer 120 formed (e.g., deposited) on a magnetic layer 110. Although FIG. 3A illustrates six metal layers 120$a$-$f$ formed between seven magnetic layers 110$a$-$g$, in general, the number of magnetic and metal layers 110, 120, respectively, in ferromagnetic region 30A may be between 2 and 15. Magnetic and metal layers 110, 120 may have any suitable thickness. In some embodiments, each magnetic and metal layer 110, 120 may have a thickness of about 2-8 Å, preferably about 2-6 Å. In some embodiments, each magnetic and metal layer 110, 120 may have a thickness greater than approximately 2 Å and less than approximately 6 Å, preferably greater than approximately 2.5 Å and less than approximately 4.5 Å, and more preferably approximately 3 Å.

In some embodiments, ferromagnetic region 30A may be formed by sequentially forming (e.g., depositing) the materials that comprise magnetic layer 110 (e.g., cobalt (Co)) and metal layer 120 (e.g., platinum (Pt), palladium (Pd), nickel (Ni), etc.) one over the other. Any suitable process or processes may be used to form the different layers 110, 120 of ferromagnetic region 30A. In some embodiments, techniques such as, for example, physical vapor deposition (e.g., ion beam sputtering, magnetron sputtering, etc.), chemical vapor deposition, plasma-enhanced chemical vapor deposition, etc. may be used to form layers 110, 120. Formation of ferromagnetic region 30A may also involve known processing steps such as, for example, selective deposition, photolithography processing, etching, annealing, etc., in accordance with any of the various conventional techniques known in the semiconductor industry. In some embodiments, during deposition of ferromagnetic region 30A (e.g., during formation of some or all of layers 110, 120), a magnetic field may be applied to set a preferred easy magnetic axis of the region (e.g., via induced anisotropy). Similarly, a strong magnetic field applied during a post-deposition high-temperature anneal step may be used to induce a preferred easy axis and a preferred pinning direction for any antiferromagnetically pinned materials or exchange coupled pinning materials. Since these techniques are known to those of ordinary skill in the art, they are not described here in greater detail.

Similar to ferromagnetic region 30A, ferromagnetic region 30B (i.e., AP2) of "fixed" region 40 may also include a multi-layer structure comprising an alternating multi-layer stack of a magnetic layer 110 and a metal layer 120. FIG. 3B illustrates an exemplary multilayer structure of ferromagnetic region 30B having magnetic layers 110$v$-110$z$ and metal layers 120$v$-120$y$. In general magnetic layers 110$v$-$z$ may include a ferromagnetic material such as cobalt (Co), iron (Fe), a cobalt based alloy, or an iron based alloy. And, metal layers 120$v$-$y$ may include materials such as platinum (Pt), palladium (Pd), nickel (Ni), gold (Au), etc. In some embodiments, magnetic layers 110$v$-110$z$ may include cobalt (Co) and the metal layers 120$v$-120$y$ may include platinum (Pt) (or palladium (Pd)). As explained above with reference to ferromagnetic region 30A, magnetic and metal layers 110, 120 of ferromagnetic region 30B may be stacked to form any number of layer pairs (marked 1-4 in FIG. 3B). Although FIG. 3B illustrates four metal layers 120$v$-120$y$ formed between five magnetic layers 110$v$-110$z$, in general, the number of magnetic and metal layers 110, 120 in ferromagnetic region 30B may be between 2 and 15. In some embodiments, the number of magnetic and metal layers 110, 120 (and magnetic layer pairs) in ferromagnetic region 30B may be less than the number in ferromagnetic region 30A. That is, in some embodiments, AP2 may have a smaller number of magnetic and metal layer pairs than AP1. The thickness of magnetic and metal layers 110, 120 in ferromagnetic region 30B may be similar to that described in connection with ferromagnetic region 30A. Magnetic and metal layers 110, 120 of ferromagnetic region 30B may also be formed in a similar manner as magnetic and metal layers 110, 120 of ferromagnetic region 30A. In some embodiments, the magnetic and metal layers (110$a$ and 110$g$ in region 30A, 110$v$ and 110$z$ in region 30B) in region 30A and 30B may be thicker than other magnetic layers 110.

In some embodiments, ferromagnetic regions 30A and 30B may have strong magnetic anisotropy and may be antiferromagnetically coupled to each other by coupling region 32. In some embodiments, strong perpendicular magnetic anisotropy (PMA) of ferromagnetic regions 30A and 30B may require one or both of these regions to have a strong crystalline orientation. In some embodiments, a strong crystalline orientation of one or both of ferromagnetic regions 30A and 30B may be desirable to maintain strong exchange coupling (e.g., large exchange coupling from the 1" peak antiferromagnetic exchange coupling through coupling layer) between these regions 30A and 30B via coupling region 32 (e.g., an approximately 4 Å thick ruthenium (Ru) layer). Strong crystalline orientation (in some case with large grain size) of a region positioned under intermediate region 50 (see FIG. 1), which functions as a tunnel barrier in a magnetic tunnel junction device such as, for example, an MRAM, may result in a rough tunnel barrier and may lead to reduced time dependent dielectric breakdown (TDDB) characteristics and/or endurance of a magnetoresistive device fabricated from the magnetoresistive stack 100.

In some embodiments of the current disclosure, seed region 20 may be treated or the composition of seed region 20 may be adjusted such that the degree of crystallinity of the overlying regions (regions formed on or above the seed region 20) is reduced. For example, seed region 20 may be treated or the composition of the seed region 20 may be adjusted such that the crystallinity of layers under intermediate region 50 (e.g., the tunnel barrier layer in an MTJ structure) is reduced. Reduced crystallinity of layers under intermediate region 50 may result in a smoothened (or relatively smoother) intermediate region 50 (i.e., a smoothed tunneling barrier), and thereby improve time dependent dielectric breakdown (TDDB) characteristics and life/endurance of a magnetoresistive device fabricated from magnetoresistive stack 100. The smoothened intermediate region 50 may also improve spin-torque switching efficiency of the magnetoresistive device.

With reference to FIG. 1, in some embodiments of the current disclosure, a surface of seed region 20 may be treated or otherwise conditioned prior to the formation of an overlying region thereon. For example, in some embodiments, a surface of seed region 20 may be treated prior to depositing ferromagnetic region 30A (AP1) thereon. In some embodiments, the treatment may include oxidation of the surface of the seed region 20 prior to forming the overlying region (e.g., ferromagnetic region 30A) thereon. In some embodiments, the oxidation may include exposing the surface of the seed region 20 to a flow of oxygen (substantially pure oxygen or a mixture of oxygen with other gases (e.g., approximately 2-80% oxygen in nitrogen)) having a flow rate of approximately 0.25-10 sccm (standard cubic centimeters per minute), at a pressure of approximately 0.01-10 mTorr (milliTorr), for a duration of approximately 5-50 seconds.

In some embodiments, a surface of seed region 20 may be oxidized by "natural oxidation." During "natural oxidation," the surface of the seed region 20 may be exposed to an oxygen-containing atmosphere at a pressure of approximately 0.01-10 mTorr at a temperature less than approximately 35° C. Oxidation at temperatures less than approximately 35° C. is referred to as low temperature or "natural oxidation" because it resembles (in speed and self-limiting behavior) the oxidation that occurs during exposure to air (e.g., clean-room air) at room temperatures. It should be noted that natural oxidation of the surface of the seed region 20 may be performed in an enclosed chamber (e.g., an oxidation chamber, deposition chamber, etc.) since oxidizing the surface by exposing it to clean-room air is not a viable option during IC fabrication (for example, to prevent defective devices due to contamination, etc.). In some embodiments, the surface treatment of seed region 20 may be performed without causing a vacuum break in the manufacturing process. For example, after forming the seed region 20, the surface of the formed seed region 20 may be oxidized in the same deposition chamber that was used for depositing the seed region 20, and the deposition of the overlying region (e.g., ferromagnetic region 30A) may be deposited on the oxidized surface of the seed region 20 in the same deposition chamber without causing a vacuum break. However, this is not a requirement. That is, in some embodiments, the deposition and oxidation may be carried out in different chambers during the manufacturing process without causing a vacuum break. For example, the manufacturing process may be carried out in a multi-chamber deposition system with separate chambers for deposition and oxidation.

In some embodiments, natural oxidation of the surface of the seed region 20 may include exposing the seed region 20 to substantially pure oxygen or a mixture of oxygen with other gases (e.g., approximately 2-80% oxygen in nitrogen), at a pressure of approximately 0.03-0.05 mTorr or less, for approximately 10-100 seconds, at temperatures less than approximately 35° C. In some embodiments, oxidizing the surface of seed region 20 may involve exposing the surface to substantially pure oxygen or a mixture of oxygen with other gases (e.g., approximately 2-80% oxygen in nitrogen), at a relatively higher pressure (e.g., between approximately 0.15 to 10 mTorr) for a relatively longer time (e.g., up to approximately a few thousand seconds, preferably about 100-2000 seconds), at temperatures less than approximately 35° C. The oxidation is preferably performed in a process chamber with low levels of water vapor. For example, in some embodiments, the oxidation process may be performed in a chamber with a cryo-pump or with a cold-trap (waterpump) to prevent or reduce the effect of water vapor on the oxygen treated surface of 20.

With renewed reference to FIG. 1, in some embodiments of the current disclosure, the composition of seed region 20 may be adjusted (e.g., supplemented or enhanced) by introducing additional material(s) during deposition of the seed region 20, in order to reduce crystallinity of the seed region 20 itself. As alluded to above, seed region 20 may comprise one or more of nickel (Ni), chromium (Cr), cobalt (Co), iron (Fe), and alloys thereof. In one embodiment, oxygen or nitrogen in gaseous form (e.g., dioxygen ($O_2$) or dinitrogen ($N_2$)) may be introduced during deposition of the seed region 20 such as, for example, magnetron sputtering. The result may be a seed region 20 comprising alloy oxide or alloy nitride. For example, a seed region 20 comprising nickel chromium oxide ($NiCrO_x$) or nickel chromium nitride ($NiCrN_x$) may be formed by introducing a small amount of oxygen or nitrogen in addition to nickel chromium (NiCr) as a splluttering target during deposition. In another embodiment, small atomic elements such as, for example, boron (B) and/or carbon (C), may be introduced during deposition of the seed region 20. For example, an alloy comprising nickel, chromium, and boron and/or carbon (e.g., NiCrB, NiCrC, or NiCrBC) may form the seed region 20 by adding or doping boron (B) and/or carbon (C) to a seed layer comprising nickel chromium (NiCr). Such an alloy may be fabricated by depositing, e.g., sputtering, nickel chromium (NiCr) and boron (B) and/or carbon (C) simultaneously (e.g., co-sputtering), or by using the complete alloy (e.g., NiCrB, NiCrC, or NiCrBC) as a sputtering target during deposition.

Treating the surface of the seed region 20 or adjusting the composition of the seed region 20 may reduce the roughness of the surface and/or change the surface morphology and result in reduced crystalline orientation (or texture) and smaller grain size of the region(s) grown on or above the region with oxygen-treated (i.e., oxidized) surface or the composition-adjusted region. The reduction in crystallinity of the ferromagnetic region 30A grown on such a seed region 20 may result in reduced crystallinity of the overlying regions. This reduction in crystallinity (and/or grain size) of the "fixed" region 40 may result in a smoother or smoothened intermediate region 50 with improved TDDB characteristics when the intermediate region 50 is formed on or above the "fixed" region 40. It should be noted that, in some cases involving the surface-treated seed region 20, after formation of magnetoresistive stack 100, an oxide layer may not be visible (e.g., in a cross-section) on the surface of a treated seed region 20. However, in some cases, compositional analysis (e.g., by energy-dispersive X-ray spectroscopy, etc.) may reveal the presence of an oxide (or another reaction product formed as a result of a reaction between the oxide and an adjoining region).

An exemplary method of forming magnetoresistive device 100 comprising a surface-treated seed region 20' will now be described. It should be appreciated that the described methods are merely exemplary. In some embodiments, the methods described herein may include a number of additional or alternative steps, and in some embodiments, one or more of the described steps may be omitted. Any described step may be omitted or modified, or other steps added, as long as the intended functionality of the fabricated magnetoresistive stack/structure remains substantially unaltered. Further, although a certain order is described or implied in the described methods, in general, the steps of the described methods need not be performed in the illustrated and described order. Further, the described methods may be incorporated into a more comprehensive procedure or process having additional functionality not described herein.

Figure 5A:
Figure 5B:
Figure 5C:
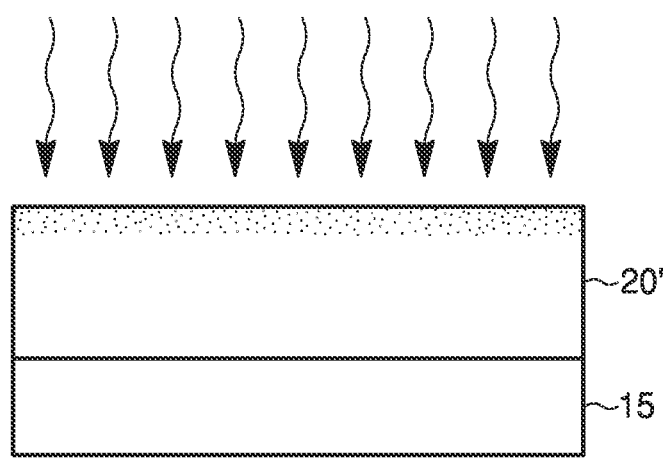

FIG. 4 is a flowchart of an exemplary method 400 of forming magnetoresistive stack 100 comprising a surface-treated seed region 20'. FIGS. 5A-5E are schematic illustrations of the magnetoresistive stack 100 at various stages of the fabrication process employing the surface treatment of seed region 20'. A bottom electrode 15 may be formed by any suitable process, including, e.g., deposition (step 410). In some embodiments, bottom electrode 15 may be formed on a surface of a substrate that defines a plane. FIG. 5A illustrates the formed bottom electrode 15. A seed region 20' may then be formed on or above the bottom electrode 15 (step 420). FIG. 5B illustrates the formed seed region 20'. An exposed surface of the formed seed region 20' (in step 420) may then be treated by exposing the surface to oxygen gas (e.g., substantially pure oxygen or a mixture of oxygen with other gases (e.g., approximately 2-80% oxygen in nitrogen)) for a duration of approximately 5-50 seconds (step 430). In some embodiments, the gas may have a flow rate of approximately 0.25-10 sccm (standard cubic centimeters per minute) and a pressure of approximately 0.01-10 mTorr (milliTorr). FIG. 5C illustrates the surface of the seed region 20' being exposed to oxygen gas.

Figure 5D:
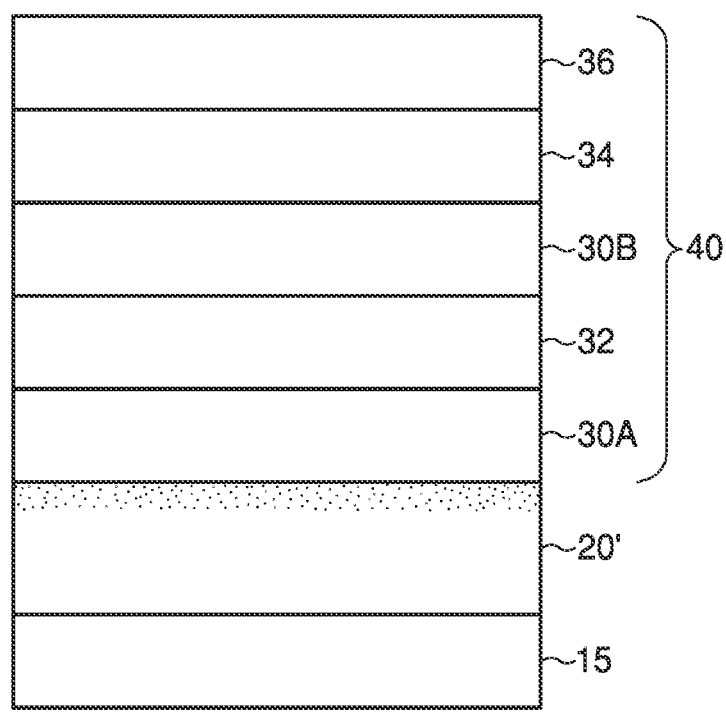
Figure 5E:
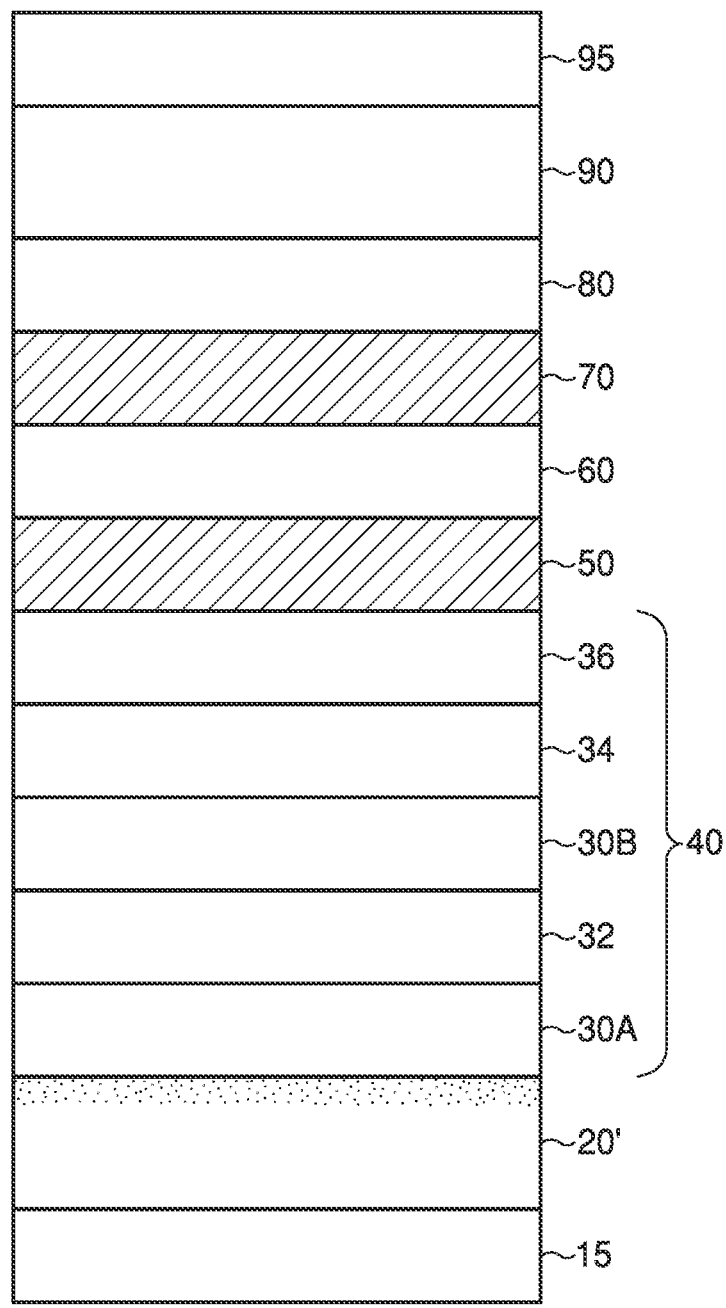

A "fixed" region 40 may then be formed on or above the seed region 20' (i.e., surface-treated seed region 20') (step 440). FIG. 5D illustrates the "fixed" region 40 formed on or above the seed region 20'. As discussed above with reference to FIGS. 1-2, forming the "fixed" region 40 may include sequentially forming (e.g., depositing) multiple regions comprising a first ferromagnetic region 30A, a coupling region 32, a second ferromagnetic region 30B, a transition region 34, and/or a reference region 36, in order. Notably, the first ferromagnetic region 30A may be formed first on or above the treated surface of the seed region 20'. After forming the "fixed" region 40 (step 440), additional regions of the magnetoresistive stack 100 (e.g., a first intermediate region 50, a "free" region 60, a second intermediate region 70, a spacer region 80, a capping region 90, and/or a top electrode 95, in order) may be sequentially formed (e.g., deposited) atop the "fixed" region 40 to form the magnetoresistive stack 100 (step 450). FIG. 5E illustrates the formed magnetoresistive stack 100 with a surface-treated seed region 20'.

Any suitable process may be used to form the different regions of magnetoresistive stack 100 (such as, for example, ferromagnetic regions 30A and 30B). In some embodiments, forming the different layers (e.g., first and second layers 110 and 120) of ferromagnetic regions 30A and 30B may include depositing the material of the layer by, for example, physical vapor deposition (e.g., ion beam sputtering, magnetron sputtering, etc.), chemical vapor deposition, plasma-enhanced chemical vapor deposition, etc. Formation of some or all of the regions may also involve known processing steps such as, for example, selective deposition, photolithography processing, etching, annealing, etc., in accordance with any of the various conventional techniques known in the semiconductor industry. In some embodiments, during deposition, a magnetic field may be applied to set a preferred easy magnetic axis of the region (e.g., via induced anisotropy). Similarly, a strong magnetic field applied during a post-deposition high-temperature anneal step may be used to induce a preferred easy axis and a preferred pinning direction for any antiferromagnetically pinned materials or exchange coupled pinning materials. Since these techniques are known to those of ordinary skill in the art, they are not described here in greater detail.

In some embodiments, magnetoresistive stack 100 may be fabricated by depositing each succeeding region directly on a surface of the region below. For instance, with reference to FIG. 1, in some embodiments, ferromagnetic region 30A may be formed directly on a surface of seed region 20 (e.g., surface-treated seed region 20'), and so forth. Any suitable method may be used to form the different regions or layers. Since suitable integrated circuit fabrication techniques (e.g., deposition, sputtering, evaporation, plating, etc.) that may be used to form the different layers are known to those of ordinary skill in the art, they are not described here in great detail. In some embodiments, forming some of the regions/layers may involve thin-film deposition processes, including, but not limited to, physical vapor deposition techniques such as ion beam sputtering and magnetron sputtering. And, forming thin insulating layers, such as the tunnel barrier layers, may involve physical vapor deposition from an oxide target, such as by radio-frequency (RF) sputtering, or by deposition of a thin metallic film followed by an oxidation step, such as oxygen plasma oxidation, oxygen radical oxidation, or natural oxidation by exposure to oxygen environment.

As explained above, exemplary embodiments of the magnetoresistive stack 100 fabricated in accordance with the method described in FIG. 4 and FIGS. 5A-5E include a "fixed" region 40 having multiple ferromagnetic regions (e.g., ferromagnetic region 30A and ferromagnetic region 30B) coupled together by a coupling region 32 (e.g., coupling region 32 made of a non-ferromagnetic material such as ruthenium (Ru), iridium (Ir), rhodium (Rh), etc.) positioned in between the ferromagnetic regions 30A and 30B. One or both of the ferromagnetic regions 30A and 30B may comprise alternating layers of cobalt (Co) (or iron (Fe), a cobalt based alloy, or an iron based alloy) and platinum (Pt) (or palladium (Pd), nickel (Ni), or gold (Au)). A surface of seed region 20', on or above which the ferromagnetic region 30A may be formed, may be surface treated by exposing the surface to a gas, such as oxygen, a mixture of oxygen and nitrogen, etc. The surface treatment may result in a reduction in the roughness of the treated surface and reduction in the crystallinity (i.e., grain size) of the regions grown on or above the treated surface, which in turn may result in facilitating the formation of a relatively smooth intermediate region 50. The relatively smooth intermediate region 50 may result in a better TDDB performance of the MTJ structure and may improve the endurance/life of the MTJ structure.

In a magnetoresistive stack 100 of FIG. 1, "fixed" region 40, intermediate region 50, and "free" region 60 may together form a magnetic tunnel junction (MTJ). To determine the effect of the above-described surface treatment on relevant parameters of an MTJ, experimental evaluations were conducted on two types of MTJ test samples. These MTJ test samples had a "fixed" region 40 with two ferromagnetic regions 30A and 30B (having the configuration illustrated in FIGS. 3A-3B, respectively) coupled together with a ruthenium (Ru) coupling region 32, and an intermediate region 50 (i.e., tunnel barrier) of magnesium oxide ($MgO_x$). Further, the various magnetic and metal layers 110 and 120, respectively, of these test samples were made of cobalt (Co) and platinum (Pt) (each layer about 3 to 4 Å thick), respectively. Seed region 20 of one of the test samples was surface treated (e.g., surface-treated seed region 20') as described above. This test sample will be referred to as surface-treated test sample. Seed region 20 of the other test sample was not surface treated and used as a baseline sample. Results from these evaluations indicate that, while the surface treatment leads to reduction in crystallinity in the regions overlying seed region 20' (e.g., resulting in a better TDDB and life/endurance of the MTJ structure), the surface treatment also causes significant reduction in PMA and antiferromagnetic coupling strength between ferromagnetic regions 30A and 30B.

FIG. 6 shows major M-H loops (magnetization (in unit of emu) versus magnetic field (in unit of Oe) hysteresis loop) of the above-described surface-treated test sample and baseline test sample (i.e., test sample without surface treatment). As would be recognized by a person of ordinary skill in the art, the right curve A (i.e., positioned at about 7500 Oe) is indicative of AP1 switching of the baseline sample and the left curve B (i.e., positioned at about 4300 Oe) is indicative of AP2 and reference region 36 switching of the baseline sample. Further, the right curve A' (i.e., positioned at about 2800 Oe) is indicative of AP1 switching of the surface-treated test sample and the left curve B' (i.e., positioned at about 1600 Oe) is indicative of AP2 and reference region 36 switching of the surface-treated test sample. These results indicate that there is a substantial change in AP1 switching and AP2 switching as a result of the surface treatment of the seed region 20'. In particular, the graph in FIG. 6 indicates that, although the crystallinity of the regions overlying the seed region 20' is reduced (e.g., resulting in a better TDDB and endurance of the MTJ structure), there is a substantial PMA and/or exchange coupling reduction due to the surface treatment of the seed region 20'.

To solve, alleviate, or minimize the above-described problem, in some embodiments of the current disclosure, seed region 20 of the magnetoresistive stack 100 may be formed in a two-step process. For example, in some embodiments, formation of the seed region 20 may comprise forming a first seed region, treating (i.e., oxidizing) a surface of the first seed region, and forming a second seed region on or above the treated surface of the first seed region. In the contemplated embodiment, the second seed region is not surface treated. As discussed above, surface treatment of the first seed region may lead to reduction in crystallinity and grain size of the region(s) grown on or above the surface-treated first seed region, resulting in a better TDDB and endurance of the magnetoresistive stack 100. Further, formation of the second seed region on or above the surface-treated first seed region may compensate for the reduced PMA and/or exchange coupling which may have resulted from surface-treating the first seed region. In the discussion below, such seed region 20 (i.e., comprising a second seed region formed on or above a treated surface of a first seed region) will be referred to as interior surface-treated seed region 20a.

An exemplary method of forming magnetoresistive stack 100 comprising an interior surface-treated seed region 20a will now be described. It should be appreciated that the described methods are merely exemplary. In some embodiments, the methods may include a number of additional or alternative steps, and in some embodiments, one or more of the described steps may be omitted. Any described step may be omitted or modified, or other steps added, as long as the intended functionality of the fabricated magnetoresistive stack/structure remains substantially unaltered. Further, although a certain order is described or implied in the described methods, in general, the steps of the described methods need not be performed in the illustrated and described order. Further, the described methods may be incorporated into a more comprehensive procedure or process having additional functionality not described herein.

Figure 8A:
Figure 8B:
Figure 8C:
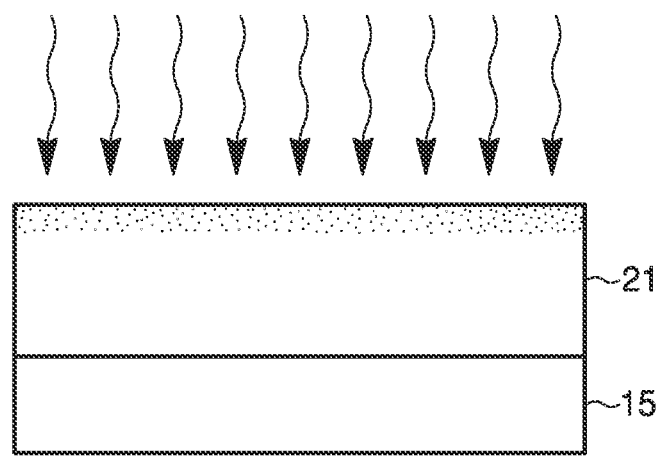
Figure 8D:
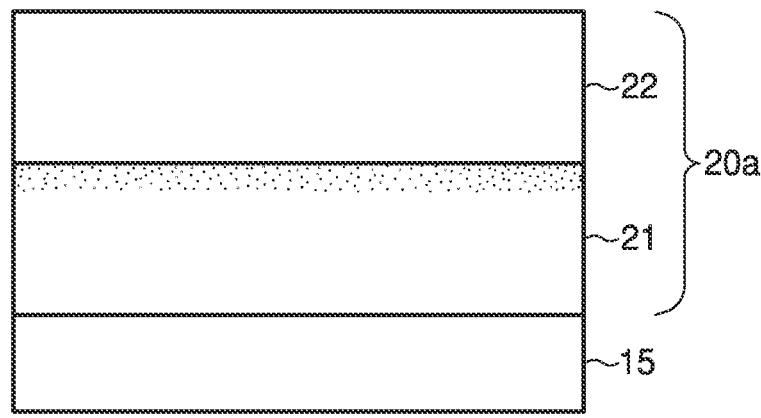

FIG. 7 is a flowchart of another exemplary method 700 of forming magnetoresistive stack 100 comprising an interior surface-treated seed region 20a. FIGS. 8A-8F are schematic illustrations of the magnetoresistive stack 100 at various stages of the fabrication process employing the interior surface treatment of seed region 20a. A bottom electrode 15 may be formed by any suitable process, including, e.g., deposition (step 710). In some embodiments, bottom electrode 15 may be formed on a surface of a substrate that defines a plane. FIG. 8A illustrates the formed bottom electrode 15. A first seed region 21 may then be formed on or above bottom electrode 15 (step 720). FIG. 8B illustrates the formed first seed region 21. Using the process described with reference to method 430 and FIG. 5C, an exposed surface of the formed first seed region 21 (in step 720) may then be treated by exposing the surface to oxygen gas for a duration of approximately 5-50 seconds (step 730). FIG. 8C illustrates the surface of the first seed region 21 being exposed to oxygen gas. A second seed region 22 may then be formed on or above the treated surface of the first seed region 21 (step 740). FIG. 8D illustrates the second seed region 22 formed on or above the treated surface of the first seed region 21. Notably, the surface-treated first seed region 21 and the second seed region 22 formed thereon may now form an interior surface-treated seed region 20a.

Figure 8E:
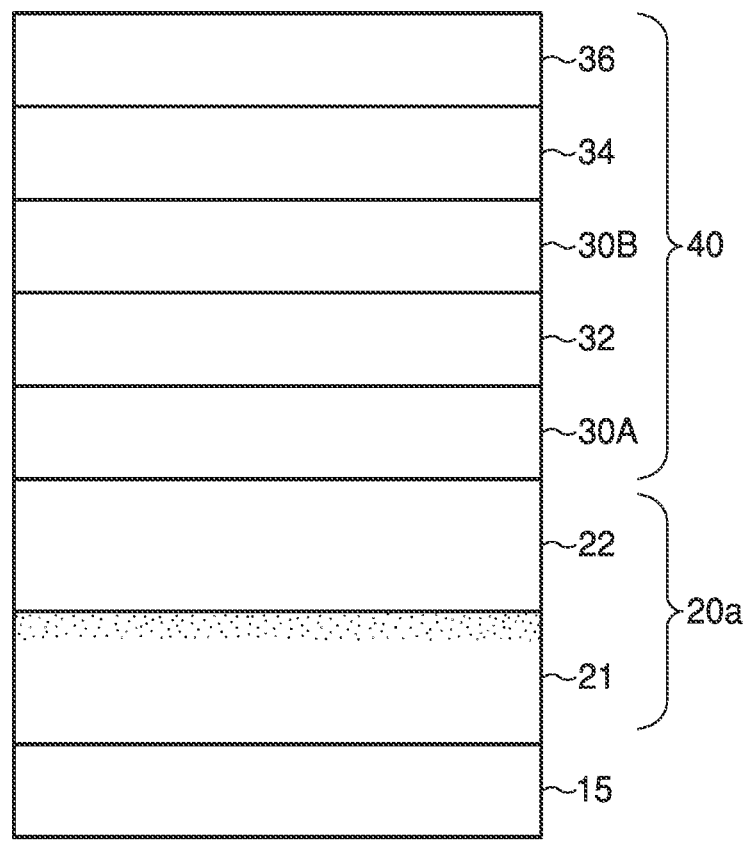
Figure 8F:
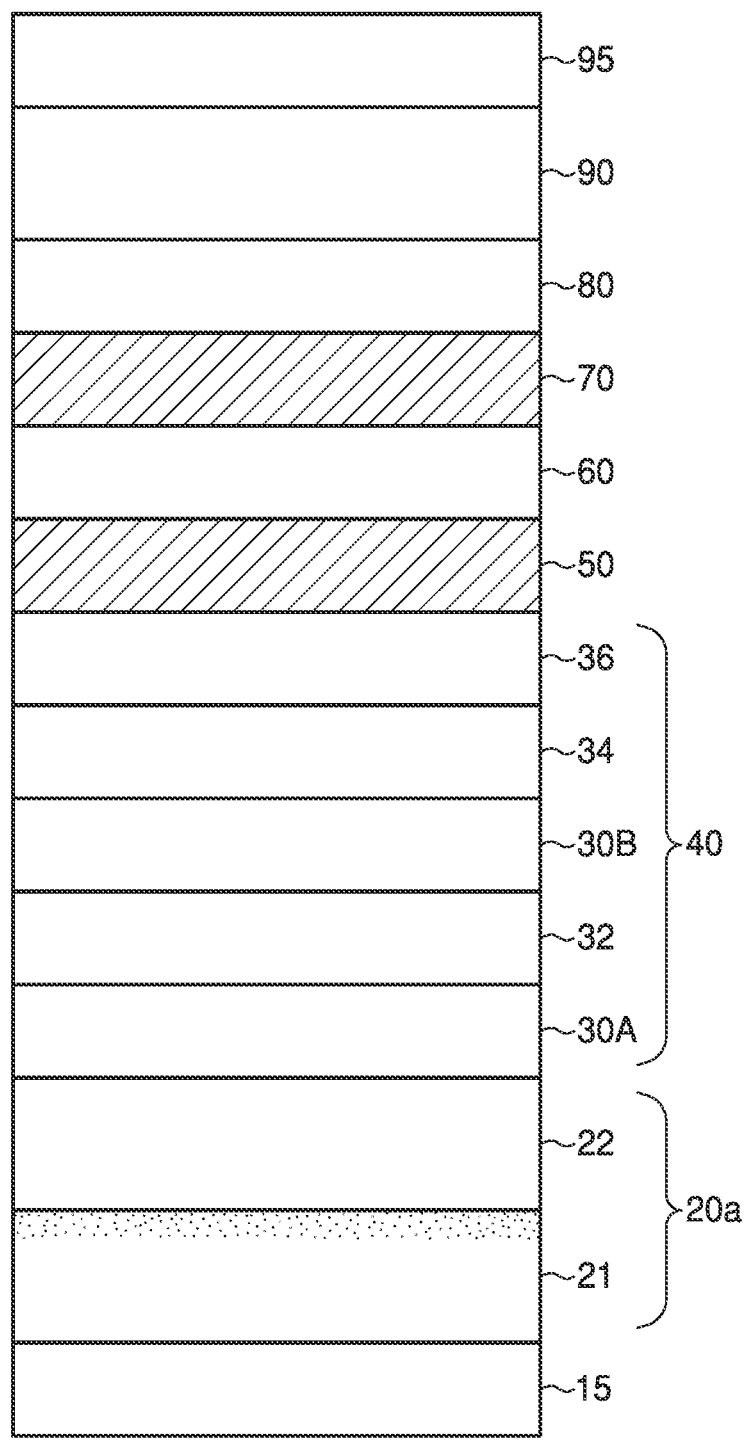

A "fixed" region 40 may then be formed on or above the seed region 20a (step 750). FIG. 8E illustrates the "fixed" region 40 formed on or above the seed region 20a. As discussed above with reference to FIGS. 1-2, forming the "fixed" region 40 may include sequentially forming (e.g., depositing) multiple regions comprising a first ferromagnetic region 30A, a coupling region 32, a second ferromagnetic region 30B, a transition region 34, and/or a reference region 36, in order. After forming the "fixed" region 40 (step 750), additional regions of the magnetoresistive stack 100 (e.g., a first intermediate region 50, a "free" region 60, a second intermediate region 70, a spacer region 80, a capping region 90, and/or a top electrode 95, in order) may be sequentially formed (e.g., deposited) atop the "fixed" region 40 to form the magnetoresistive stack 100 (step 760). FIG. 8F illustrates the magnetoresistive stack 100 with an interior surface-treated seed region 20a.

As discussed above, in a magnetoresistive stack 100 of FIG. 1, "fixed" region 40, intermediate region 50, and "free" region 60 may together form a magnetic tunnel junction (MTJ) having an MR and an RA. To determine the effect of the above-described interior surface-treated seed region 20a on the performance of the MTJ indicated by various parameters, experimental evaluations were conducted on multiple exemplary MTJ test samples. These MTJ test samples had a "fixed" region 40 with two ferromagnetic regions 30A and 30B (having the configuration illustrated in FIGS. 3A-3B, respectively) coupled together with a ruthenium (Ru) coupling region 32, and an intermediate region 50 (e.g., tunnel barrier) of magnesium oxide ($MgO_x$). Further, the various magnetic and metal layers 110 and 120, respectively, of these test samples were made of cobalt (Co) and platinum (Pt) (each layer about 3 to 4 Å thick), respectively. Some of the test samples included an interior surface-treated seed region 20a (i.e., a surface-treated first seed region 21 and a second seed region 22 formed thereon, together forming an interior surface-treated seed region 20a as discussed above with respect to steps 720-740 and FIGS. 8B-8D) of varying dimensions (e.g., thickness of the second seed region 22 varying from approximately 10 Å to 40 Å). These test samples will be referred to as interior surface-treated test samples. Other test samples did not include any surface-treated seed regions and were used as baseline samples. Results of these evaluations indicate that the MTJs including an interior surface-treated seed region 20a obtained improved levels of PMA and exchange coupling (i.e. closer to those of the baseline samples), compared to the MTJs including a surface-treated seed region 20' discussed above with reference to FIG. 4 and FIGS. 5A-5E.

Figure 9A:
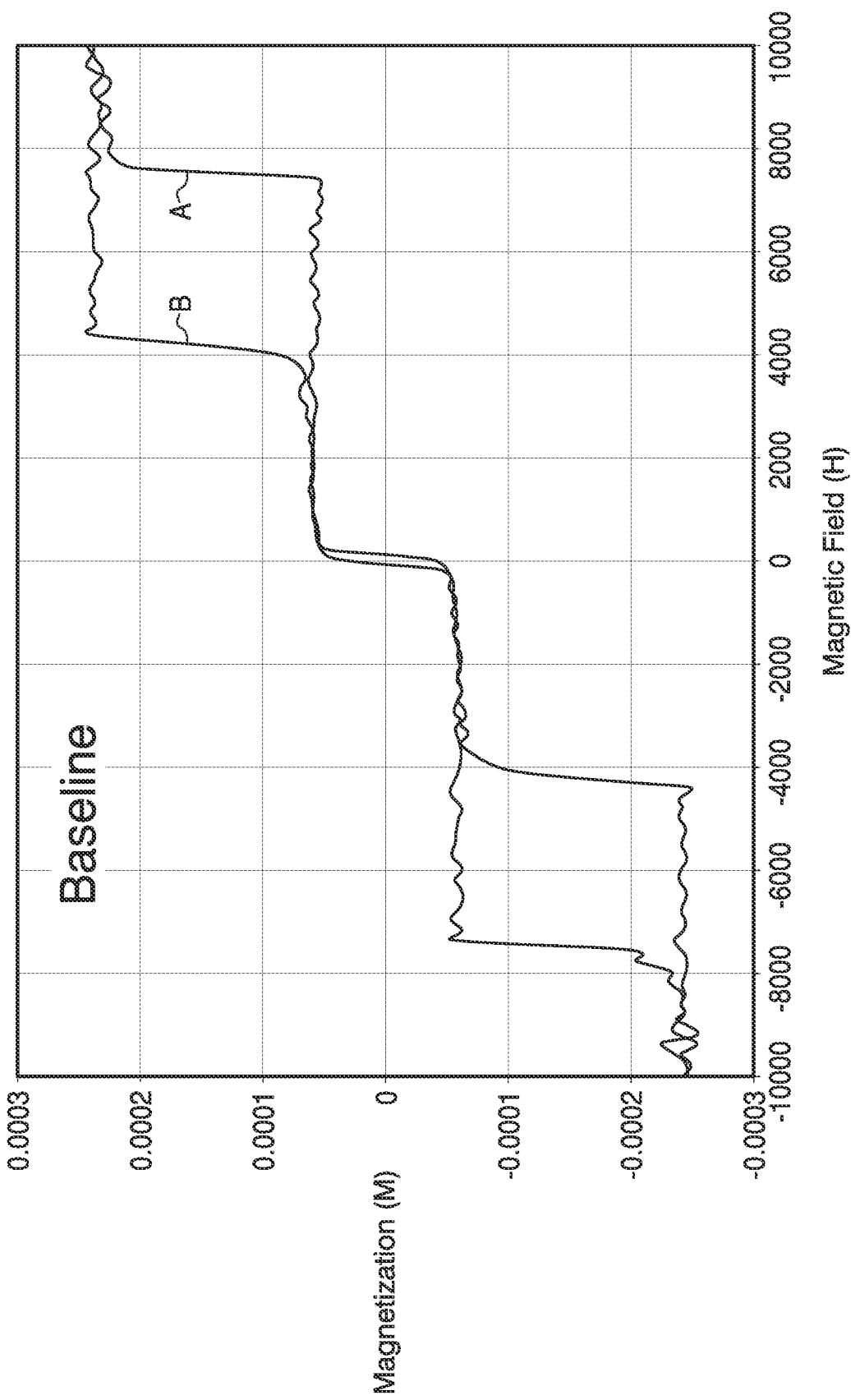
Figure 9B:
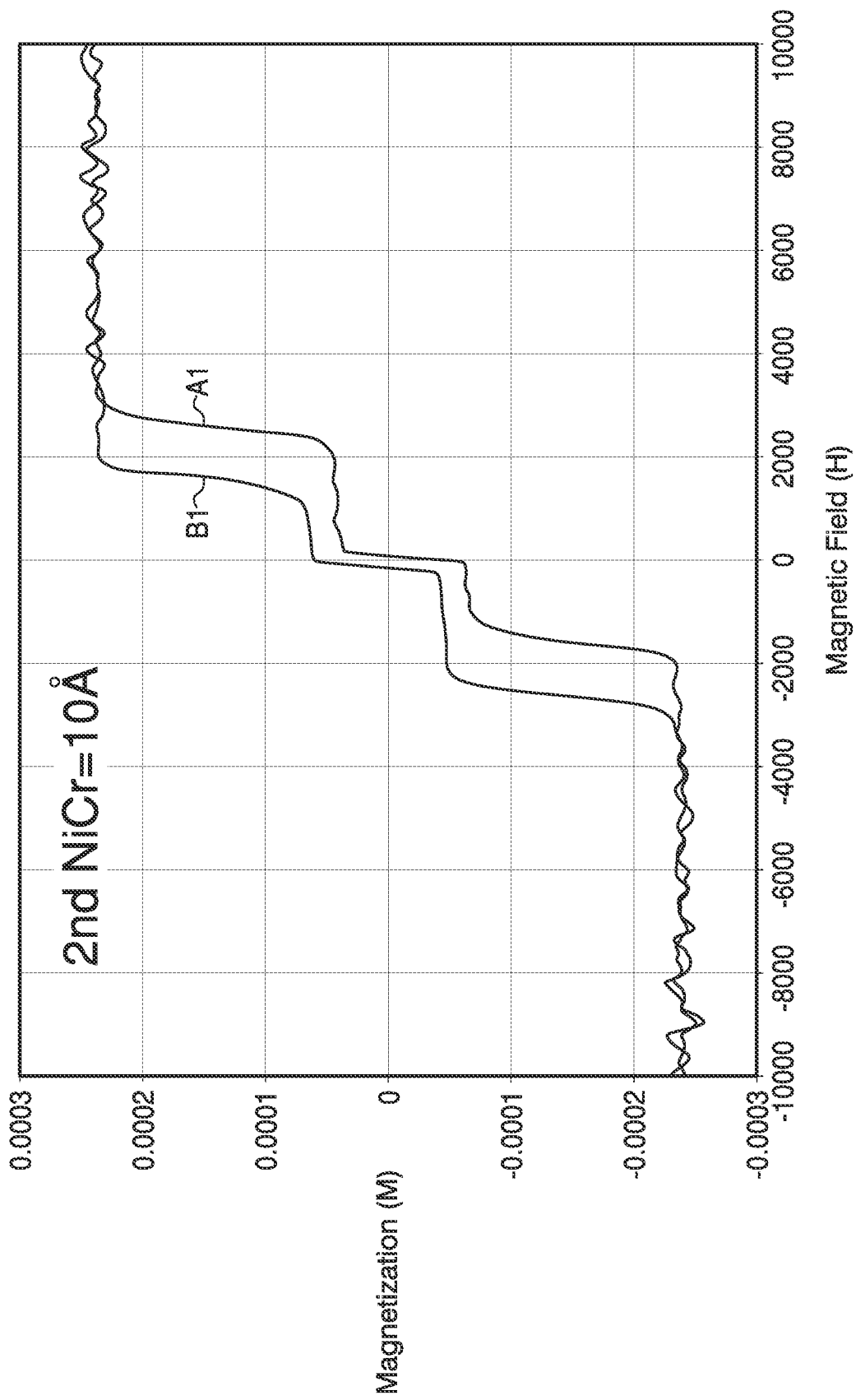
Figure 9C:
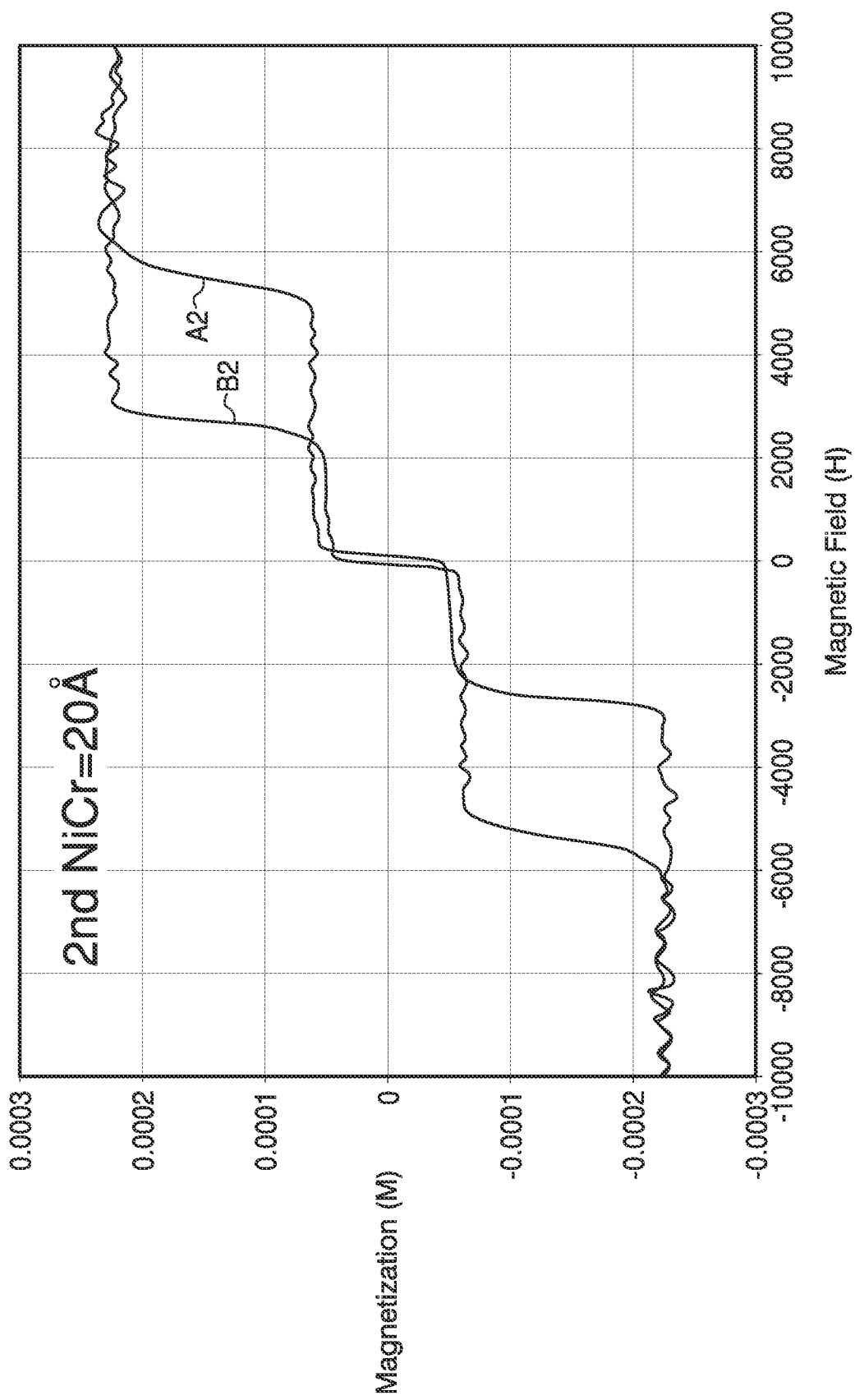
Figure 9D:
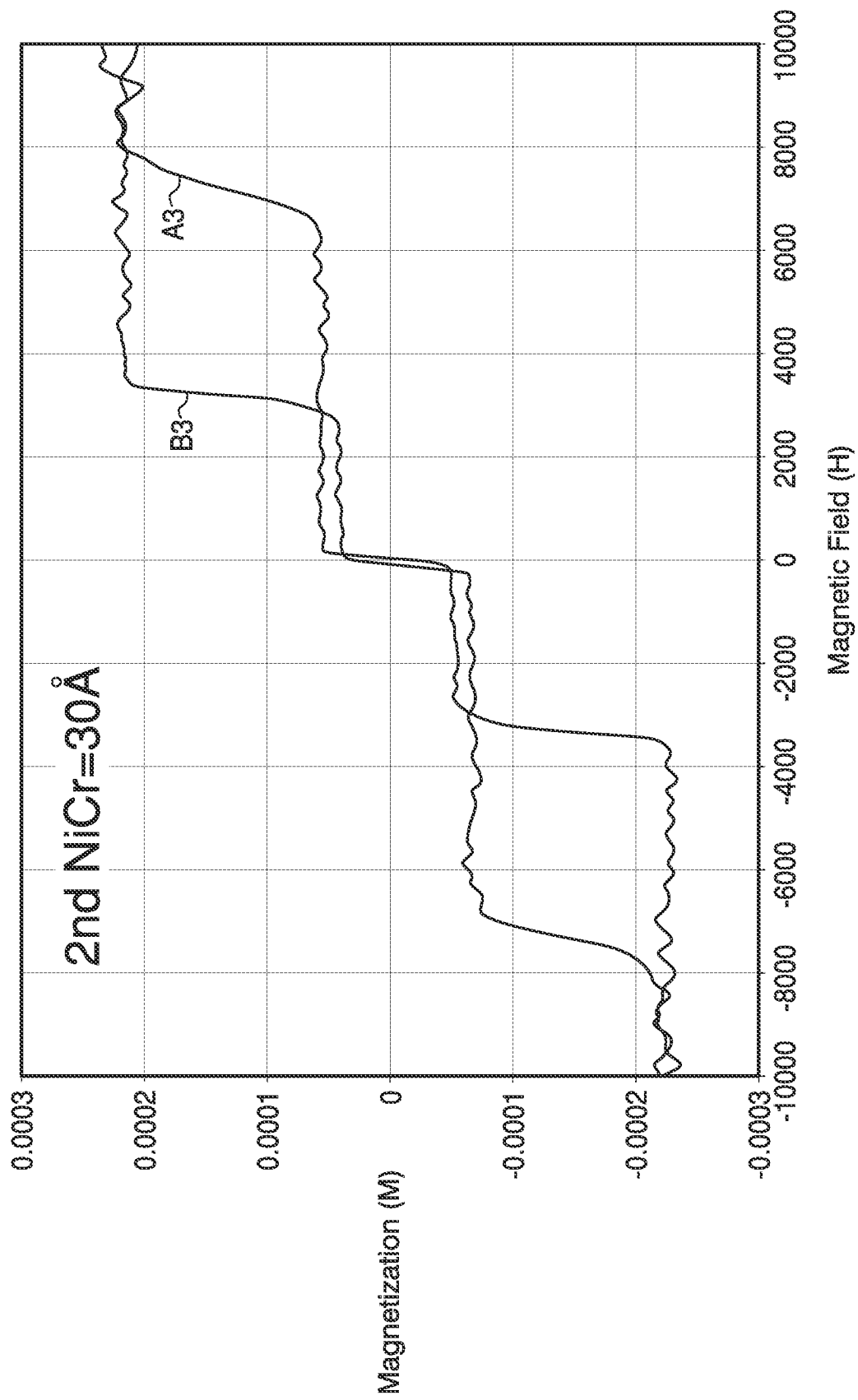
Figure 9E:
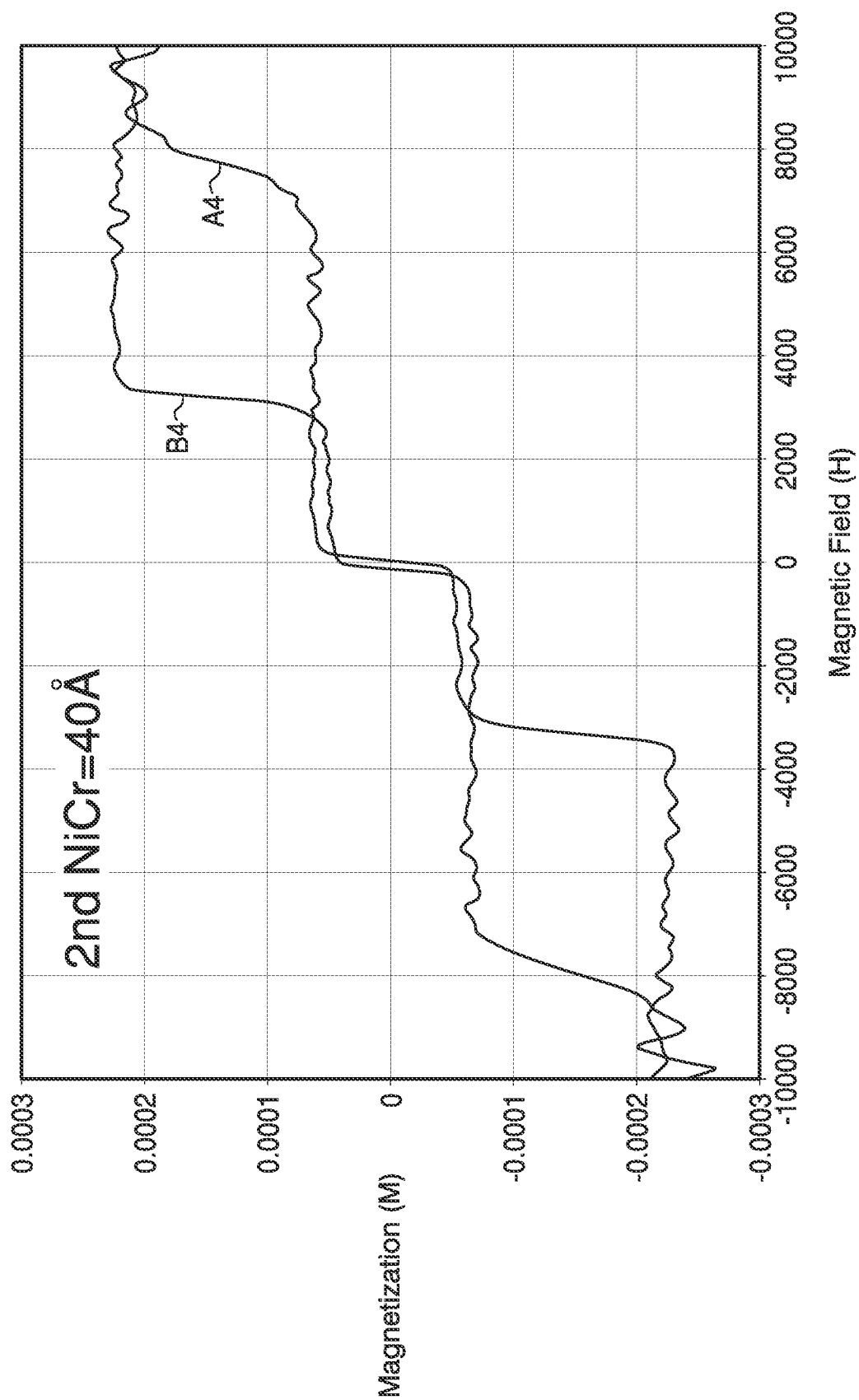
Figure 10A:
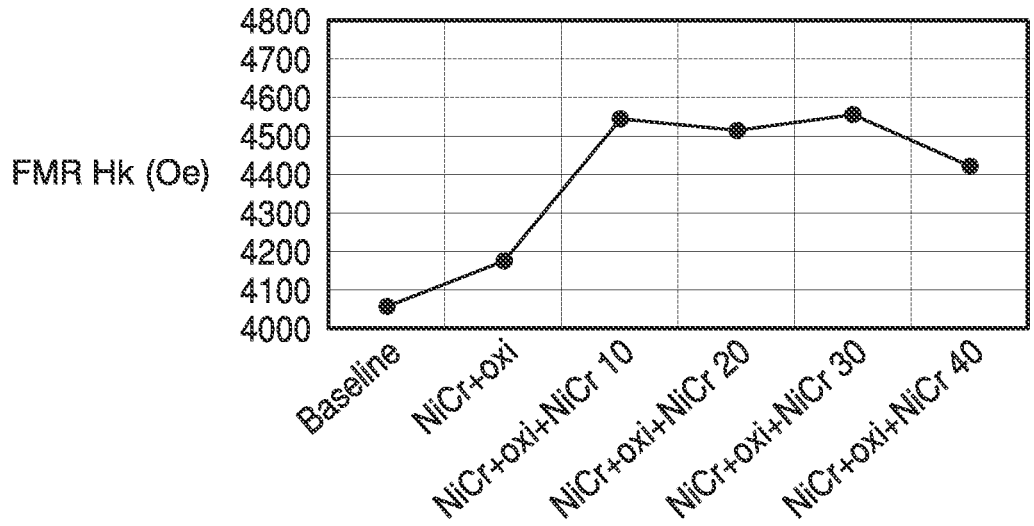
Figure 10B:
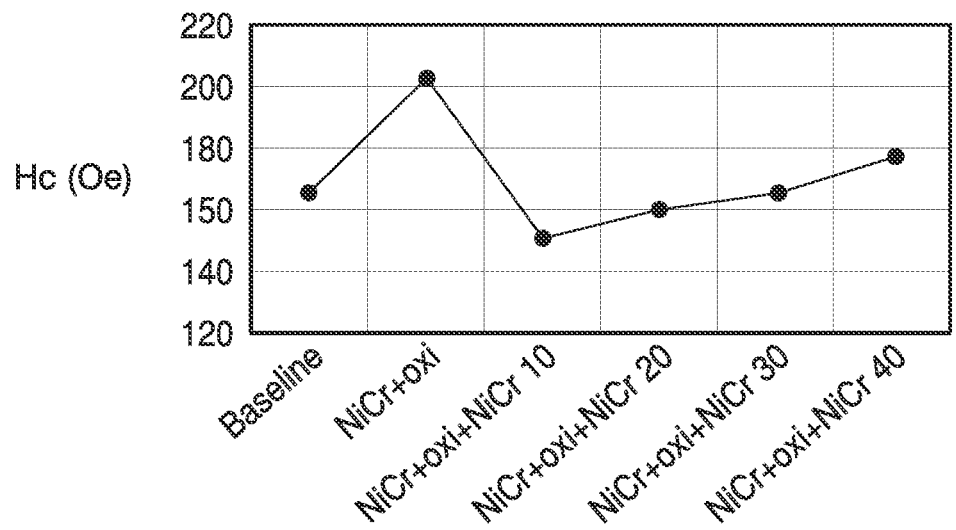
Figure 10C:
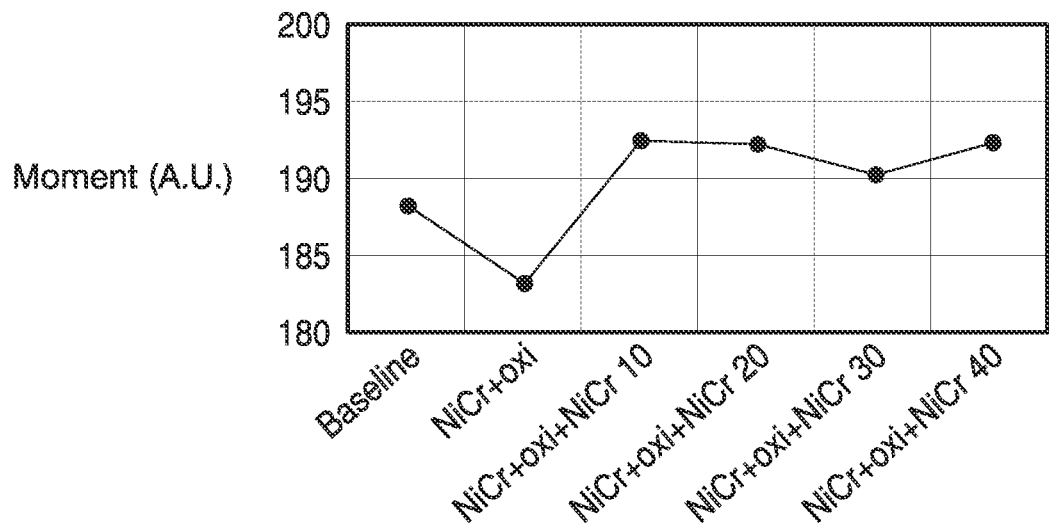
Figure 10D:
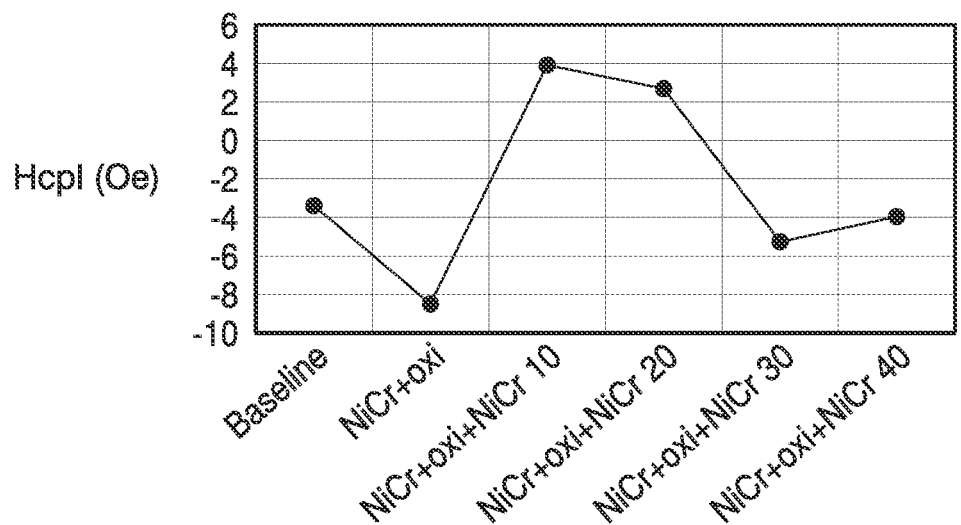

FIGS. 9A-9E show major M-H loops of the above-described interior surface-treated test samples and baseline test samples (without surface treatment). Generally, FIG. 9A shows a major M-H loop of the baseline sample (i.e., without any surface treatment) and FIGS. 9B-9E show major M-H loops of the interior surface-treated test samples of varying dimensions. In particular, FIGS. 9B-9E show major M-H loops of the interior surface-treated test samples comprising second seed regions 22 measuring approximately 10 Å, 20 Å, 30 Å, and 40 Å in thickness, respectively. As alluded to above with reference to FIG. 6, the right curves A and A1-A4 indicate AP1 switching of the respective test samples, and the left curves B and B1-B4 indicate AP2 and reference region 36 switching of the respective test samples. These results indicate that, as the thickness of the second seed region 22 increases, PMA and/or exchange coupling of the interior surface-treated test samples are substantially improved to levels comparable to those of the baseline samples. Therefore, by forming a second seed region 22 on or above a surface-treated first seed region 21 (thereby forming interior surface-treated seed region 20a), reasonable levels of PMA and exchange coupling may be achieved while also controlling the crystallinity of the region(s) formed on or above the interior surface-treated seed region 20a (i.e., while improving TDDB and life/endurance of the magnetoresistive stack 100). The smoothed tunnel barrier may also improve tunnel barrier breakdown voltage and spin-torque switching efficiency.

FIGS. 10A-10D compare the magnetic properties (perpendicular anisotropy field Hk, coercivity Hc, magnetic moment, and coupling field Hcpl) of free layers for the MTJ test samples described above, including baseline test samples, surface-treated test samples, and interior surface-treated test samples of varying dimensions. As can be seen in these figures, the interior surface-treated test samples showed a slightly increased Hk compared to the baseline test samples and the surface-treated test samples. Further, the interior surface-treated test samples having a second seed region 22 with thicknesses of approximately 30 Å to 40 Å showed coercivity Hc, magnetic moment, and coupling field Hcpl comparable (i.e., similar) to those of the baseline samples. These improvements in the properties of the interior surface-treated test samples are believed to be due to the addition of a second seed region 22 on or above the surface-treated first seed region 21.

FIG. 11 compares the electrical properties MR and RA of the MTJ test samples described above (i.e., baseline test samples, surface-treated test samples, and interior surface-treated test samples of varying dimensions). As can be seen in this figure, the surface-treated test samples and the interior surface-treated test samples showed a substantial increase in RA. This result indicates that the surface-treated seed region 20' and the interior surface-treated seed region 20a may lead to a reduction of crystallinity in the region(s) on or above the seed regions 20' and 20a, resulting in a smoothened tunneling barrier. Further, the interior surface-treated test samples showed an improved MR that is closer to the MR of the baseline samples, compared to that of the surface-treated test samples. Therefore, these results indicate that a relatively high RA and a reasonable level of MR may be achieved by adding a second seed region 22 having a certain thickness on or above a surface-treated seed region 21 to form an interior surface-treated seed region 20a. In other words, the second seed region 22 thickness may be adjusted based on PMA and exchange coupling strength requirements.

As alluded to above in reference to FIG. 1, in some embodiments of the current disclosure, the composition of seed region 20 of the magnetoresistive stack 100 may be adjusted to reduce crystallinity and/or grain size of the seed region 20. As discussed above, adding certain materials during deposition of the seed region 20 may lead to reduction in crystallinity and/or grain size of the region(s) grown on or above the seed region 20, resulting in a better TDDB and endurance of the magnetoresistive stack 100. Further, such a seed region 20 may not significantly alter the desired level of PMA and/or exchange coupling. In the discussion below, such seed region 20 (i.e., comprising materials having crystallinity-reducing effect) will be referred to as composition-adjusted seed region 25.

An exemplary method of forming magnetoresistive stack 100 comprising a composition-adjusted seed region 25 will now be described. It should be appreciated that the described methods are merely exemplary. In some embodiments, the methods may include a number of additional or alternative steps, and in some embodiments, one or more of the described steps may be omitted. Any described step may be omitted or modified, or other steps added, as long as the intended functionality of the fabricated magnetoresistive stack/structure remains substantially unaltered. Further, although a certain order is described or implied in the described methods, in general, the steps of the described methods need not be performed in the illustrated and described order. Further, the described methods may be incorporated into a more comprehensive procedure or process having additional functionality not described herein. For the sake of brevity, description of the regions overlying the "fixed" region 40 and formation thereof, which have been described in great detail above, will not be repeated in the following discussion.

Figure 13A:
Figure 13B:
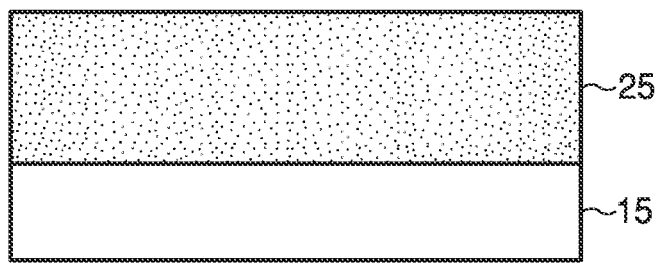

FIG. 12 is a flowchart of another exemplary method 1200 of forming magnetoresistive stack 100 comprising a composition-adjusted seed region 25. FIGS. 13A-13D are schematic illustrations of the magnetoresistive stack 100 at various stages of the fabrication process employing the composition-adjusted seed region 25. A bottom electrode 15 may be formed by any suitable process, including, e.g., deposition (step 1210). In some embodiments, bottom electrode 15 may be formed on a surface of a substrate that defines a plane. FIG. 13A illustrates the formed bottom electrode 15. A composition-adjusted seed region 25 may then be formed on or above bottom electrode 15 (step 1220). FIG. 13B illustrates the formed composition-adjusted seed region 25.

In one embodiment, to form the composition-adjusted seed region 25, oxygen or nitrogen in gaseous form (e.g., dioxygen ($O_2$) or dinitrogen ($N_2$)) may be added during deposition of an alloy comprising one or more of nickel (Ni), chromium (Cr), cobalt (Co), and iron (Fe). For the purposes of illustration only, an example alloy of nickel chromium (NiCr) will be used in the following discussion. However, it should be noted that oxygen or nitrogen may be added during deposition of a different type of alloy, and the same or similar crystallinity reduction effect may be achieved.

Nickel chromium (NiCr) films with a small amount of oxygen or nitrogen may reduce the crystallinity and grain size of the nickel chromium. The oxygen or nitrogen may be introduced during deposition such as, e.g., magnetron sputtering, by setting the nickel chromium as the sputtering target and introducing, i.e., sputtering, a small amount (e.g., approximately 1 to 30% content) of oxygen or nitrogen with an ionization agent such as, e.g., argon (Ar) or xenon (Xe). During such deposition process, the nickel chromium (NiCr) sputtering target, which is in solid form initially, may be broken up by gaseous ions (i.e., ionization agent) into nanoscopic particles, which may interact with the oxygen or nitrogen before forming a layer over (e.g., coat) the bottom electrode 15. In some embodiments, the oxygen or nitrogen may be introduced at approximately 1-30% partial pressure during sputtering of the ionization agent. The formed composition-adjusted seed region 25 may comprise nickel chromium oxide ($NiCrO_x$) or nickel chromium nitride ($NiCrN_x$), for example.

In another embodiment, small atomic elements such as, e.g., boron (B) and/or carbon (C), may be added during deposition of nickel chromium (NiCr) to form the composition-adjusted seed region 25. The atomic elements may be introduced during deposition by sputtering the atomic elements and nickel chromium (NiCr) simultaneously, or by using an alloy comprising both the atomic elements and nickel chromium (NiCr) (e.g., NiCrB, NiCrC, or NiCrBC) as a sputtering target. During this process, the atomic elements may be added to or doped over nickel chromium, producing a nano crystalline-smoothed nickel chromium (NiCr) seed region. The resultant composition-adjusted seed region 25 may comprise nickel chromium boron (NiCrB), nickel chromium carbon (NiCrC), or nickel chromium boron carbon (NiCrBC), for example.

In yet another embodiment, each of the above composition-adjusted seed regions 25 comprising different combinations of materials (e.g., nickel chromium oxide ($NiCrO_x$), nickel chromium nitride ($NiCrN_x$), nickel chromium boron (NiCrB), nickel chromium carbon (NiCrC), and nickel chromium boron carbon (NiCrBC)) may be used by itself to form a complete composition-adjusted seed region 25 or may be combined with a simpler alloy such as, for example, nickel chromium (NiCr), to form a complete composition-adjusted seed region 25. For example, composition-adjusted seed region 25 may comprise a bilayer (e.g., $NiCr/NiCrN_x$, $NiCrN_x/NiCr$, etc.), tri-layer (e.g., $NiCr/NiCrN_x/NiCr$, $NiCrN_x/NiCr/NiCrN_x$, etc.), or multi-layer structure (e.g., $NiCr/[NiCrN_x/NiCr]*n$, $[NiCrN_x/NiCr]*n/NiCrN_x$, etc., where n>1). In the following discussion, such "layered" composition-adjusted seed region 25 will be referred to as bilayer composition-adjusted seed region, tri-layer composition-adjusted seed region, or multi-layer composition-adjusted seed region, respectively.

Figure 13C:
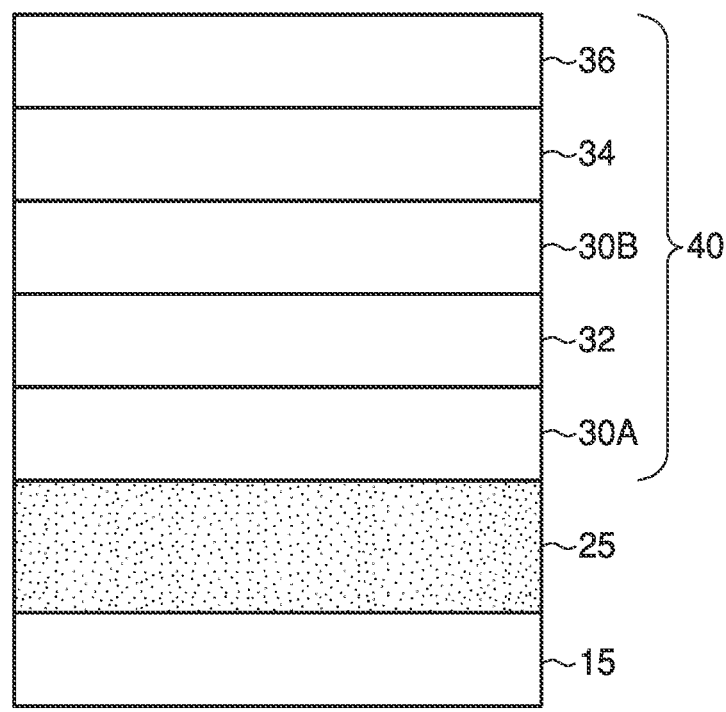
Figure 13D:
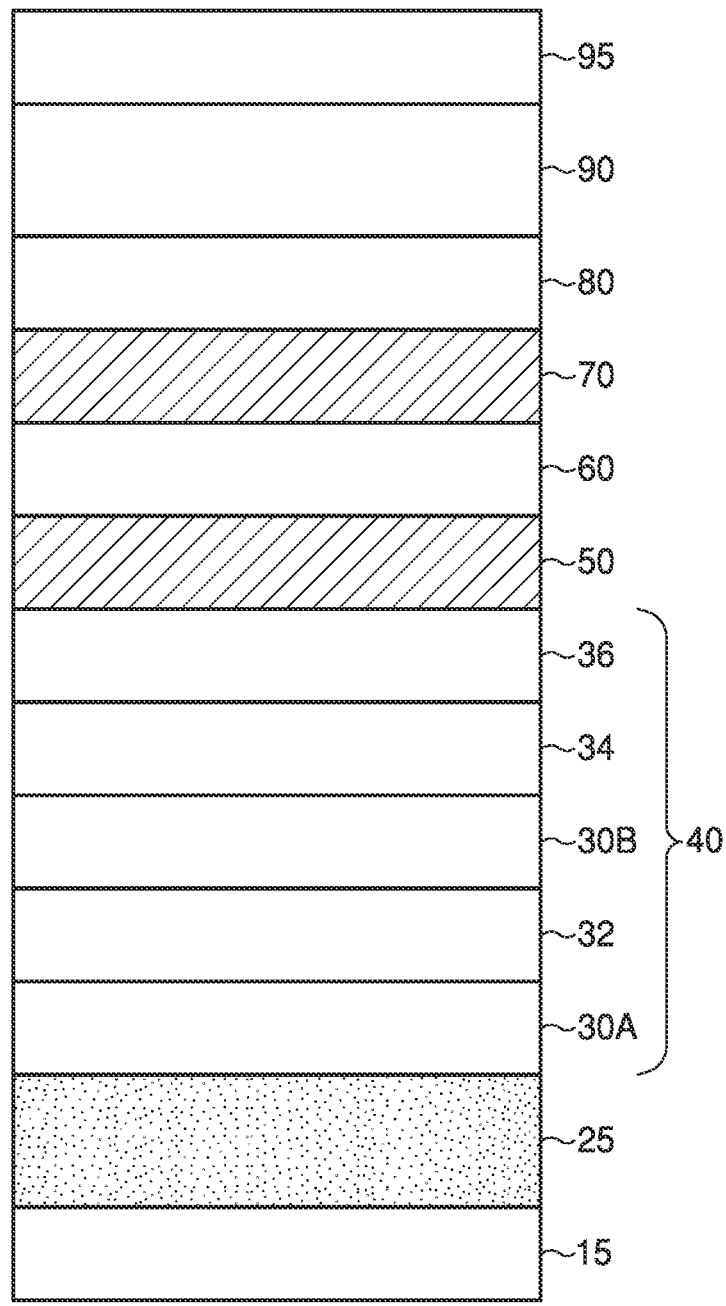

Referring back to FIG. 12, a "fixed" region 40 may then be formed on or above the composition-adjusted seed region 25 (step 1230). FIG. 13C illustrates the "fixed" region 40 formed on or above the composition-adjusted seed region 25. As discussed above with reference to FIGS. 1-2, forming the "fixed" region 40 may include sequentially forming (e.g., depositing) multiple regions comprising a first ferromagnetic region 30A, a coupling region 32, a second ferromagnetic region 30B, a transition region 34, and/or a reference region 36, in order. After forming the "fixed" region 40 (step 1230), additional regions of the magnetoresistive stack 100 (e.g., a first intermediate region 50, a "free" region 60, a second intermediate region 70, a spacer region 80, a capping region 90, and/or a top electrode 95, in order) may be sequentially formed (e.g., deposited) atop the "fixed" region 40 to form the magnetoresistive stack 100 (step 1240). FIG. 13D illustrates the magnetoresistive stack 100 with a composition-adjusted seed region 25.

FIG. 14 shows normalized major M-H loops of magnetoresistive stacks 100 comprising various types of composition-adjusted seed region 25 (i.e., composition-adjusted test samples), in comparison with a normalized major M-H loop of a magnetoresistive stack 100 without composition adjustment (i.e., a baseline test sample comprising nickel chromium (NiCr) as the seed region). In particular, FIG. 14 shows normalized major M-H loops of magnetoresistive stacks 100 comprising layered composition-adjusted seed regions 25, in comparison with that of a baseline test sample. These results indicate that PMA and/or exchange coupling of the composition-adjusted test samples are comparable to those of the baseline sample. Therefore, by adjusting the composition of the seed region to have desirable structural characteristics, reasonable levels of PMA and exchange coupling may be achieved while also controlling the crystallinity of the region(s) formed on or above the composition-adjusted seed region 25 (i.e., while improving TDDB and life/endurance of the magnetoresistive stack 100). As alluded to above, the smoothed tunnel barrier may also improve tunnel barrier breakdown voltage and spin-torque switching efficiency.

FIG. 15A compares the normalized electrical properties, MR and RA, of the MTJ test samples described above (i.e., a baseline test sample comprising nickel chromium (NiCr) and composition-adjusted test samples comprising nickel chromium nitride (NiCrN)) (i.e., same samples as those shown in FIG. 14). FIG. 15B compares the normalized magnetic properties, perpendicular anisotropy field Hk and magnetic moment, of the MTJ test samples described above (i.e., a baseline test sample comprising nickel chromium (NiCr) and a composition-adjusted test sample comprising nickel chromium nitride (NiCrN)). In both FIG. 15A and FIG. 15B, similar electrical and magnetic properties can be observed with the composition-adjusted test sample in comparison with those of the baseline test sample. These results indicate that adequate levels of MR, RA, Hk, and magnetic moment may be achieved by adjusting the composition of the seed region to form a composition-adjusted seed region 25.

MTJ devices (formed using magnetoresistive stacks 100) may include a sensor architecture or a memory architecture (among other architectures). For example, in an MTJ device having a memory configuration, the MTJs may be electrically connected to an access transistor and configured to couple or connect to various conductors, which may carry one or more control signals, as shown in FIG. 16. The MTJ devices may be used in any suitable application, including, e.g., in a memory configuration. In such instances, the MTJ devices may be formed as integrated circuits comprising a discrete memory device (e.g., as shown in FIG. 17A) or an embedded memory device having a logic therein (e.g., as shown in FIG. 17B), each including MRAM, which, in one embodiment, is representative of one or more arrays of MRAM having a plurality of magnetoresistive stacks/structures, according to certain aspects of certain embodiments disclosed herein.

In one aspect, a method of fabricating a magnetoresistive device is disclosed. The method may comprise forming an electrically conductive region and forming a first seed region on one side of the electrically conductive region. A surface of the first seed region may be treated by exposing the surface to a gas. A second seed region may be formed on the treated surface of the first seed region. The method may also comprise forming a magnetically fixed region on one side of the second seed region.

Various embodiments of the disclosed method may alternatively or additionally include the following features: treating the surface of the first seed region may comprise exposing the surface to substantially pure oxygen; treating the surface of the first seed region may comprise exposing the surface to a mixture of approximately 2-80% oxygen in other gases; treating the surface of the first seed region may comprise exposing the surface to oxygen at a pressure less than or equal to approximately 10 milliTorr; treating the surface of the first seed region may comprise exposing the surface to the gas at a pressure approximately between 0.01 and 10 milliTorr; treating the surface of the first seed region may comprise exposing the surface to the gas for a time period less than or equal to approximately 50 seconds; treating the surface of the first seed region may comprise exposing the surface to oxygen for a time period less than or equal to approximately 50 seconds at a temperature less than or equal to approximately 35 degrees Celsius; treating the surface of the first seed region may comprise exposing the surface to oxygen without causing a vacuum break; treating the surface of the first seed region may comprise exposing the surface to oxygen in a chamber with a cryo-pump or a cold-trap; and treating the surface of the first seed region may occur in a same deposition chamber that was used for forming the first seed region.

In another aspect, a method of fabricating a magnetoresistive is disclosed. The disclosed method may comprise forming an electrically conductive region and forming a composition-adjusted seed region on one side of the electrically conductive region. Forming the composition-adjusted seed region may comprise depositing a first seed region and adding a gas during the deposition of the first seed region. The method may also comprise forming a magnetically fixed region on one side of the composition-adjusted seed region.

Various embodiments of the disclosed method may alternatively or additionally include the following features: the gas may be one of oxygen and nitrogen; the first seed region may comprise one or more of: nickel, chromium, cobalt, and iron; forming the composition-adjusted seed region may further comprise depositing a second seed region; and forming the composition-adjusted seed region may further comprise depositing a second seed region, wherein each of the first seed region and the second seed region comprises one or more of: nickel, chromium, cobalt, and iron.

In another aspect, a method of fabricating a magnetoresistive is disclosed. The disclosed method may comprise forming an electrically conductive region and forming a composition-adjusted seed region on one side of the electrically conductive region. Forming the composition-adjusted seed region may comprise depositing a first seed region and adding one or more atomic elements during the deposition of the first seed region. The method may also comprise forming a magnetically fixed region on one side of the composition-adjusted seed region.

Various embodiments of the disclosed method may alternatively or additionally include the following features: the one or more atomic elements may comprise one or more of: boron and carbon; adding the one or more atomic elements during the deposition of the first seed region may comprise sputtering the first seed region and the one or more atomic elements simultaneously; the first seed region may comprise one or more of: nickel, chromium, cobalt, and iron; and forming the composition-adjusted seed region may further comprise depositing a second seed region.

Although various embodiments of the present disclosure have been illustrated and described in detail, it will be readily apparent to those skilled in the art that various modifications may be made without departing from the present disclosure or from the scope of the appended claims.

What is claimed is:

1. A method of fabricating a magnetoresistive device, comprising:

forming an electrically conductive region;

forming a first seed region on one side of the electrically conductive region, wherein forming the first seed region includes depositing the first seed region on the one side of the electrically conductive region, wherein the first seed region comprises one or more of: nickel, chromium, cobalt, iron, or an alloy thereof;

treating a surface of the first seed region by exposing the surface to a gas comprising oxygen, wherein treating the surface of the first seed region by exposing the surface to the gas comprising oxygen includes adding the gas comprising oxygen during the deposition of the first seed region, wherein treating the surface of the first seed region by exposing the surface to the gas comprising oxygen reduces a crystallinity and/or a grain size of at least a portion of the first seed region;

forming a second seed region on the treated surface of the first seed region, wherein the second seed region comprises one or more of: nickel, chromium, cobalt, iron, or an alloy thereof; and forming a magnetically fixed region on one side of the second seed region.

2. The method of claim 1, wherein treating the surface of the first seed region comprises exposing the surface to substantially pure oxygen.

3. The method of claim 1, wherein treating the surface of the first seed region comprises exposing the surface to a mixture of approximately 2-80% oxygen in other gases.

4. The method of claim 1, wherein treating the surface of the first seed region comprises exposing the surface to oxygen at a pressure less than or equal to approximately 10 milliTorr.

5. The method of claim 1, wherein treating the surface of the first seed region comprises exposing the surface to the gas at a pressure approximately between 0.01 and 10 milliTorr.

6. The method of claim 1, wherein treating the surface of the first seed region comprises exposing the surface to the gas for a time period less than or equal to approximately 50 seconds.

7. The method of claim 1, wherein treating the surface of the first seed region comprises exposing the surface to oxygen for a time period less than or equal to approximately 50 seconds at a temperature less than or equal to approximately 35 degrees Celsius.

8. The method of claim 1, wherein treating the surface of the first seed region comprises exposing the surface to oxygen without causing a vacuum break.

9. The method of claim 1, wherein treating the surface of the first seed region comprises exposing the surface to oxygen in a chamber with a cryo-pump or a cold-trap.

10. The method of claim 1, wherein treating the surface of the first seed region occurs in a same deposition chamber that was used for forming the first seed region.

11. A method of fabricating a magnetoresistive device, comprising:
    forming an electrically conductive region;
    forming a composition-adjusted seed region on one side of the electrically conductive region, wherein forming the composition-adjusted seed region comprises:
        depositing a first seed region, wherein the first seed region comprises one or more of: nickel, chromium, cobalt, or iron; and
        adding a gas during the deposition of the first seed region to reduce a crystallinity and/or a grain size of at least a portion of the first seed region; and
    forming a magnetically fixed region on one side of the composition-adjusted seed region.

12. The method of claim 11, wherein the gas is one of oxygen and nitrogen.

13. The method of claim 11, wherein forming the composition-adjusted seed region further comprises:
    depositing a second seed region.

14. The method of claim 11, wherein forming the composition-adjusted seed region further comprises:
    depositing a second seed region, wherein each of the first seed region and the second seed region comprises one or more of: nickel, chromium, cobalt, and iron.

15. A method of fabricating a magnetoresistive device, comprising:
    forming an electrically conductive region;
    forming a composition-adjusted seed region on one side of the electrically conductive region, wherein forming the composition-adjusted seed region comprises:
        depositing a first seed region; and
        adding one or more atomic elements during the deposition of the first seed region to reduce a crystallinity and/or a grain size of at least a portion of the first seed region;
    forming a magnetically fixed region on one side of the composition-adjusted seed region;
    forming a first intermediate region on one side of the magnetically fixed region;
    forming a magnetically free region on one side of the first intermediate region;
    forming a second intermediate region on one side of the magnetically free region;
    forming a spacer region on one side of the second intermediate region; and
    forming a capping region and/or a top electrode on one side of the spacer region.

16. The method of claim 15, wherein the one or more atomic elements comprise one or more of: boron and carbon.

17. The method of claim 15, wherein adding the one or more atomic elements during the deposition of the first seed region comprises sputtering the first seed region and the one or more atomic elements simultaneously.

18. The method of claim 15, wherein the first seed region comprises one or more of: nickel, chromium, cobalt, or iron.

19. The method of claim 15, wherein forming the composition-adjusted seed region further comprises:
    depositing a second seed region, wherein the second seed region comprises one or more of: nickel, chromium, cobalt, iron, or an alloy thereof.

20. The method of claim 11, further comprising:
    forming a first intermediate region on one side of the magnetically fixed region;
    forming a magnetically free region on one side of the first intermediate region;
    forming a second intermediate region on one side of the magnetically free region;
    forming a spacer region on one side of the second intermediate region; and
    forming a capping region and/or a top electrode on one side of the spacer region.

* * * * *